United States Patent [19]

Maeda

[11] Patent Number: 5,760,448
[45] Date of Patent: *Jun. 2, 1998

[54] SEMICONDUCTOR DEVICE AND A METHOD FOR MANUFACTURING THE SAME

[75] Inventor: Hiroshi Maeda, Matsubara, Japan

[73] Assignee: Sharp Kabushiki Kaisha, Osaka, Japan

[*] Notice: The term of this patent shall not extend beyond the expiration date of Pat. No. 5,471,082.

[21] Appl. No.: 561,833

[22] Filed: Nov. 27, 1995

Related U.S. Application Data

[63] Continuation-in-part of Ser. No. 305,601, Sep. 14, 1994, Pat. No. 5,471,082.

[30] Foreign Application Priority Data

Dec. 27, 1993 [JP] Japan ................................. 5-333781

[51] Int. Cl.⁶ ................................................. H01L 27/02
[52] U.S. Cl. .......................... 257/362; 257/370; 257/577; 257/592
[58] Field of Search ................................. 257/362, 370, 257/369, 378, 577, 592, 655

[56] References Cited

U.S. PATENT DOCUMENTS 5,471,082   11/1995   Maeda ................................. 257/362

FOREIGN PATENT DOCUMENTS 61-36711   8/1986   Japan.
62-69678   3/1987   Japan.

*Primary Examiner*—Mark V. Prenty
*Attorney, Agent, or Firm*—Nixon & Vanderhy, P.C.

[57] ABSTRACT

A semiconductor device having an electrostatic discharge protection device and at least one accompanying device selected from the group comprising of a N or P channel MOS transistor, CMOS, bipolar transistor and BiCMOS, in which the electrostatic discharge protection device comprises a vertical type bipolar transistor including; a semiconductor substrate; an epitaxial layer laminated on the semiconductor substrate; a buried collector of a first conductivity type which is formed of the semiconductor substrate or which is formed from the surface of the semiconductor substrate to the epitaxial layer; a base of a second conductivity type which is a lightly doped well and formed on the epitaxial layer; and an emitter of the first conductivity type and formed on the surface layer of the base of the second conductivity type; and in which the base is adapted to have impurity concentration and depth so that a punch-through is generated between the emitter and the collector of the electrostatic discharge protection device when a voltage higher than the operation voltage of the accompanying device or a voltage lower than the ground voltage is applied between the emitter and the collector, the base and the emitter being shorted with each other.

11 Claims, 35 Drawing Sheets

FIG. 11
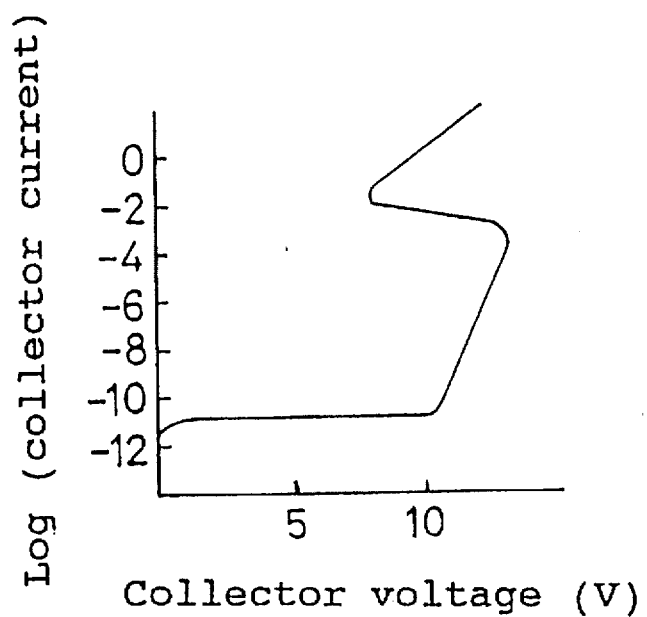
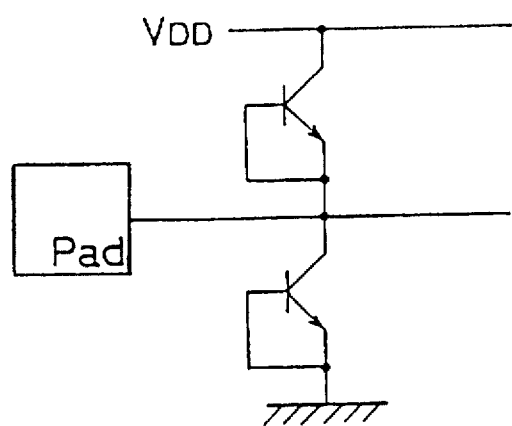
FIG. 12

FIG. 29
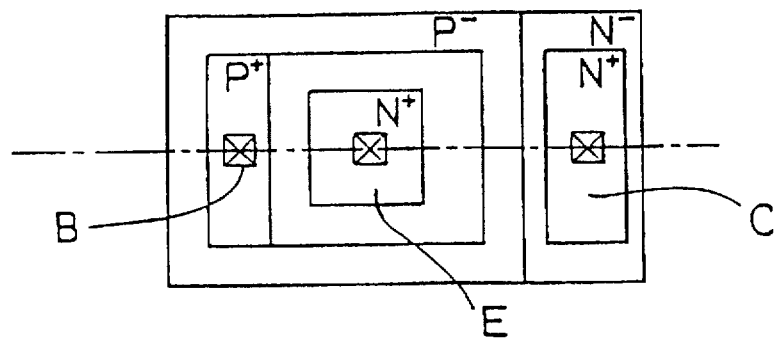
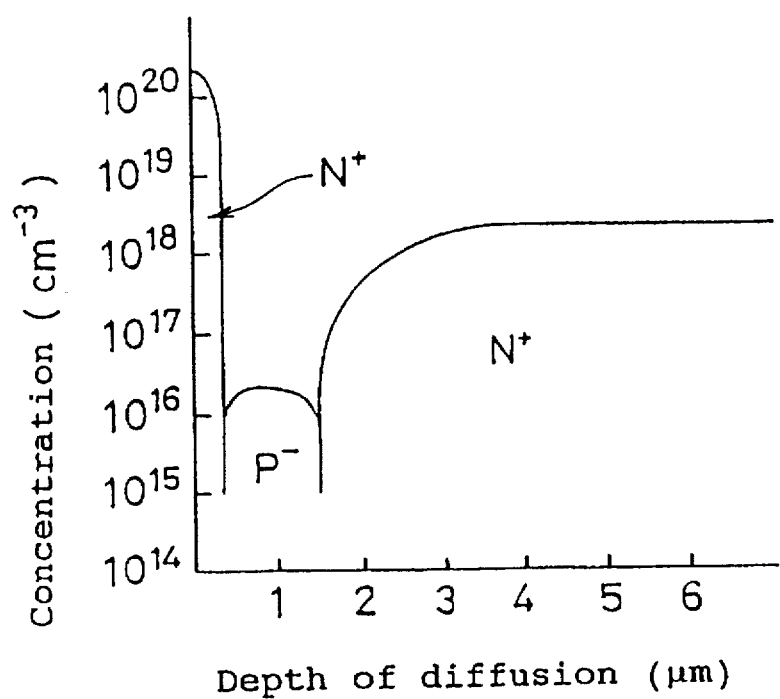
FIG. 30

FIG. 39
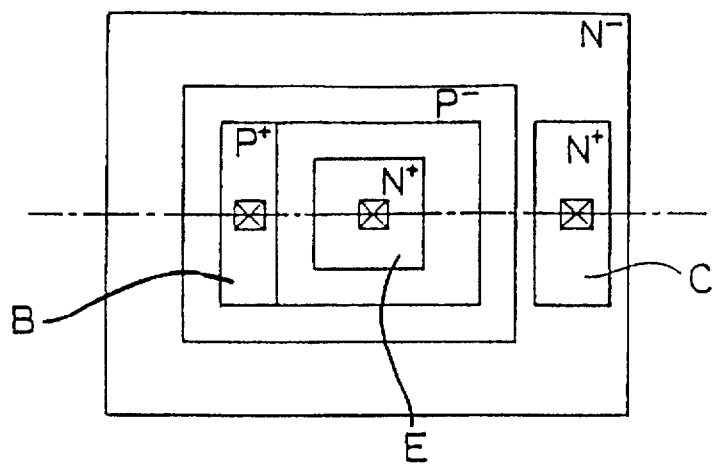
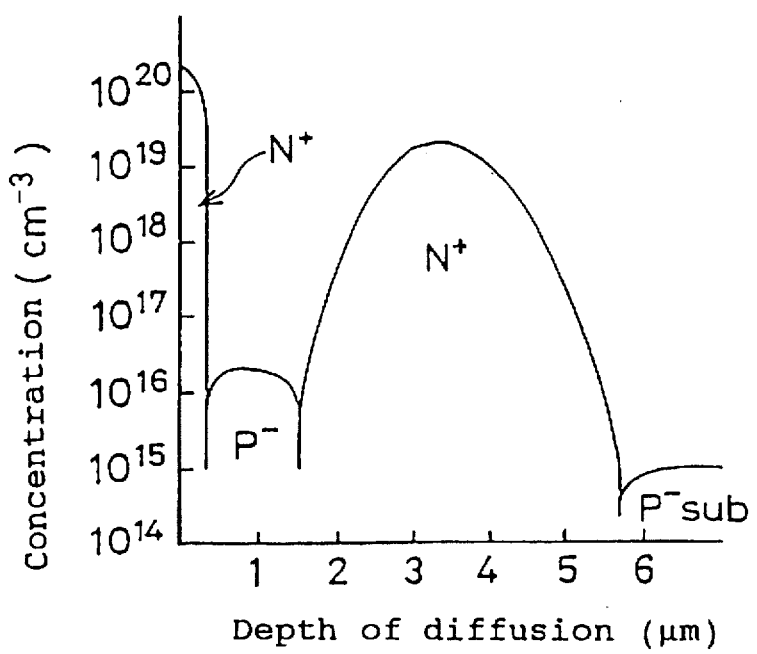
FIG. 40

*FIG. 109* (PRIOR ART)
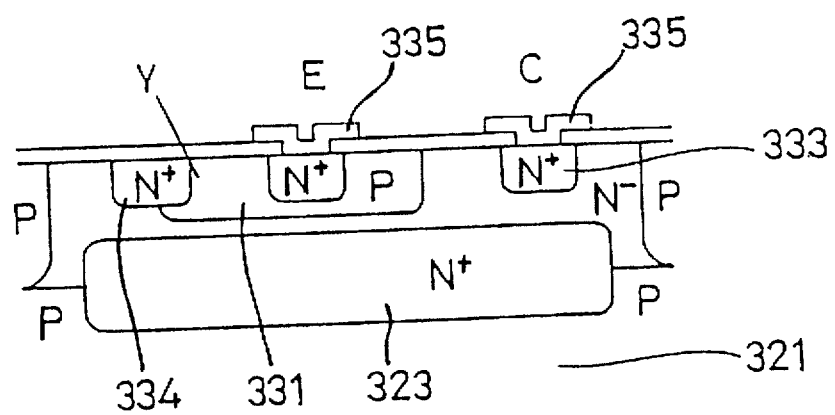
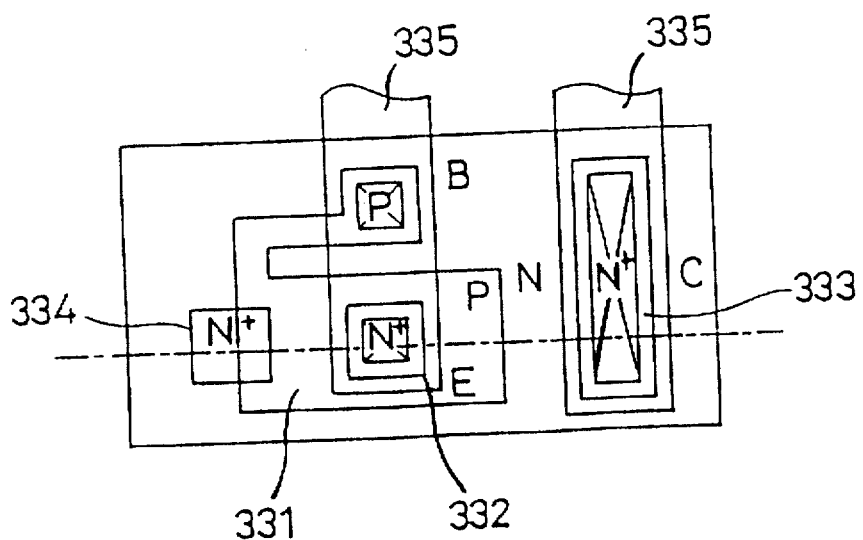
*FIG. 110* (PRIOR ART)

FIG. 111 (PRIOR ART)
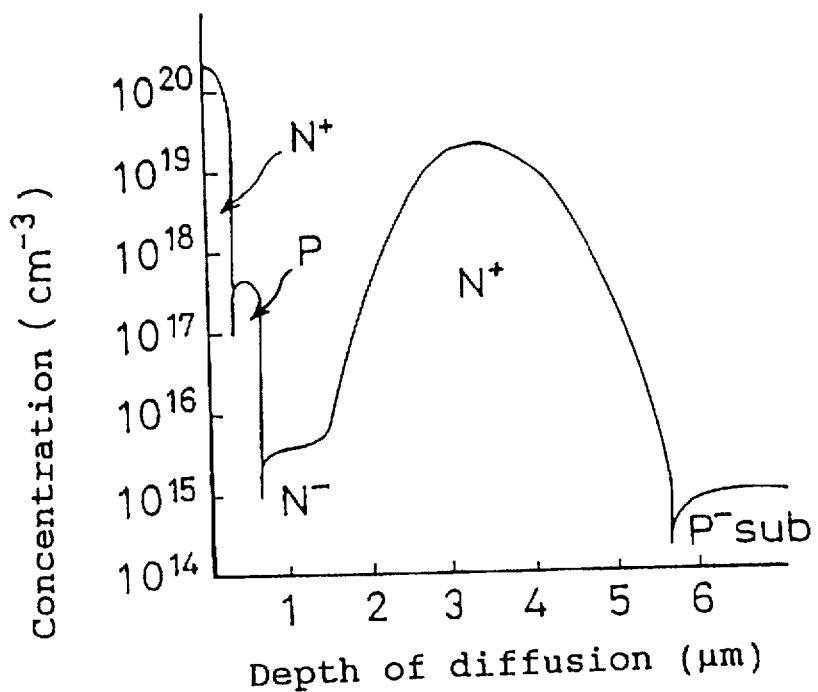
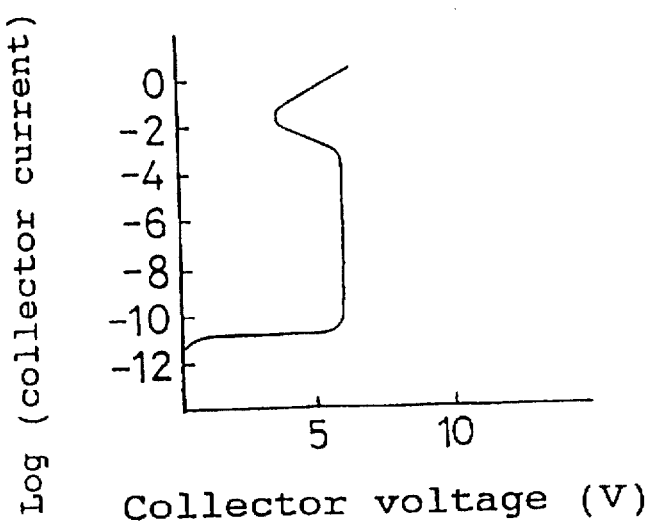
FIG. 112 (PRIOR ART)

5,760,448

1

SEMICONDUCTOR DEVICE AND A METHOD FOR MANUFACTURING THE SAME

This application is a continuation-in-part of application of Ser. No. 08/305,601, filed Sep. 14, 1994, now U.S. Pat. No. 5,471,082.

BACKGROUND OF THE INVENTION

1. Field of the Invention

The present invention relates to a semiconductor device and a method for manufacturing the same. In particular, it relates to a semiconductor device such as MOS, BiCMOS and bipolar transistor which includes a vertical type bipolar transistor therein as an electrostatic discharge protection device (ESD) and the method for manufacturing the same.

2. Description of the Related Art

Various type of semiconductor devices providing a protective circuit for the device have been developed.

(i) As an example, Japanese Unexamined Patent Publication Sho 62 (1987)-69678 discloses a horizontal type bipolar transistor as an electrostatic discharge protection device which is formed without using an epitaxial layer in the manufacturing process for MOS transistor. In the horizontal bipolar transistor, an avalanche breakdown current is used as a trigger and an electric current flows by snap-back. A method for manufacturing the horizontal bipolar transistor is described as follows.

As shown in FIG. 94, a thermal oxide film and a nitride film are formed on an entire P⁻ substrate 301 which serves as a base and has a concentration of about $2 \times 10^{15}$ cm$^{-3}$, and then the surface of the substrate is etched so as to leave a nitride film 302 in a region used for an active region.

Subsequently, as shown in FIG. 95, the substrate is oxidized by LOCOS method and $^{49}$BF$_2^+$ ions are implanted to a desired region for forming a base contact diffusion region by using a resist as a mask 303.

Then, $^{75}$As$^+$ ions are implanted to a desired region for forming an emitter and collector by using a resist as a mask 304 as shown in FIG. 96. The emitter and the base are shorted with each other by using a metal wiring (represented by the reference numeral 305 in FIG. 98) as shown in FIG. 97, thereby obtaining the horizontal type bipolar transistor.

FIG. 98 shows a plan view of the semiconductor device of this type. When a reverse bias is applied to the collector in the horizontal bipolar transistor of the electrostatic discharge protection device, avalanche breakdown occurs between the collector and the base. The avalanche breakdown current triggers to function a transistor and induces a snap-back, whereby an electric current flows. If a semiconductor device employs the horizontal bipolar transistor in an input part of the circuit, excessive current and voltage caused by static electricity are allowed to escape from the circuit, so that the inside circuit can be protected.

(ii) Alternatively, in addition to the MOS process described above, another device comprising a horizontal bipolar transistor as an electrostatic discharge protection device has been developed in which snap-back occurs by using a punch-through breakdown as a trigger.

In this type of device, as shown in FIG. 99, a thermal oxide film and a nitride film are formed on a P⁻ substrate 311, and then the nitride film formed on a device isolation formation region is removed to leave a nitride film 312 in a region used for an active region. The distance X between the emitter and collector formed therein is arranged to be shorter

2 than that of the first example described above in order to induce punch-through breakdown between the collector and emitter at a voltage lower than that of inducing avalanche breakdown between the collector and base.

Subsequently, the substrate is oxidized by LOCOS method and the nitride film 312 is removed as shown in FIG. 100. Then, $^{49}$BF$_2^+$ ions are implanted to a desired region for forming a base contact diffusion region by using a resist as a mask 313.

After that, $^{75}$As$^+$ ions are implanted to a desired region for forming an emitter and collector by using a resist as a mask 314 as shown in FIG. 101.

The emitter and the base are shorted with each other by using a metal wiring (represented by 315 in FIG. 103) as shown in FIG. 102, thereby obtaining the horizontal type bipolar transistor.

FIG. 103 shows a plan view of the semiconductor device of this type. When a reverse bias is applied to the collector in the horizontal bipolar transistor of the electrostatic discharge protection device, punch-through breakdown occurs between the collector and the emitter. The punch-through breakdown current triggers to function a transistor and induces a snap-back, whereby an electric current flows. If a semiconductor device employs the horizontal type bipolar transistor in an input part of the circuit, the excessive current and voltage caused by static electricity are allowed to escape from the circuit, so that the inside circuit can be protected.

(iii) Further, Japanese Patent Publication Sho 61 (1986)-36711 discloses a vertical type bipolar transistor as an electrostatic discharge protection device, in which an avalanche breakdown current is used as a trigger and induces snap-back.

As shown in FIG. 104, spin-on-glass (SOG) containing antimony (Sb), not shown, is applied to a P type substrate 321 to form an N$^+$ buried collector 323 by driving in, and the SOG on the substrate 321 is removed.

Next, as shown in FIG. 105, an N epitaxial layer 324 is grown on the substrate 321 and the surface of the substrate 321 is oxidized by thermal treatment to form an SiO$_2$ film 325. After etching SiO$_2$ 325 by using a resist as a mask 326 for forming P well to be used as a device isolation region, $^{11}$B$^+$ ions are implanted.

FIG. 106 shows that a P well 327 is formed by conducting P well thermal diffusion for forming an device isolation region and then a resist 328 is applied and patterned by photolithographic process, and that the oxide film 325 in the base formation region is etched and $^{11}$B$^+$ ions are implanted.

FIG. 107 shows that a resist 329 is applied on the substrate 321 on which the base 331 is formed and then an oxide film 330 on the emitter and collector contact diffusion region of the bipolar transistor is etched and $^{75}$As$^+$ ions are implanted. At this time, the diffusion region bridging from the base to the collector region of the N epitaxial layer 324 is simultaneously formed.

FIG. 108 shows that a contact for forming an electrode is formed after forming an emitter 332, collector contact diffusion region 333 and diffusion region 334.

Then, Al-Si electrode 335 is formed as shown in FIG. 109 such that the emitter and the base are shorted with each other as shown in FIG. 110.

FIG. 111 shows an impurity concentration profile beneath the emitter.

The bipolar transistor used as the electrostatic discharge protection device has an emitter concentration of about $2 \times 10^{20}$ cm$^{-3}$, base concentration of about $5 \times 10^{17}$ cm$^{-3}$ and collector N⁻ epitaxial concentration of about $5\times10^{15}$ cm$^{-3}$. When the reverse bias is applied to the device, avalanche breakdown occurs at about 6 V in a region Y (FIG. 109) near the surface of p-n junction between the collector and the base. The avalanche breakdown current triggers to function a transistor and induces a snap-back as shown in FIG. 112. As the base concentration is $5\times10^{17}$ cm$^{-3}$, punch-through does not occur between the collector and the emitter. Accordingly, if a semiconductor device employs the vertical type transistor in an input part of the circuit, excessive current and voltage caused by static electricity are allowed to escape from the circuit, so that the inside circuit can be protected.

(iv) In BiCMOS process, the horizontal and vertical bipolar transistors are formed in the MOS and bipolar portions, respectively to form a desired BiCMOS.

However, when excessive current flows in the horizontal bipolar transistor of the MOS processes (i) and (ii) which is used as the electrostatic discharge protection device, the instantaneous excessive energy applied to the transistor can not be absorbed sufficiently, so that the p-n junction in the inside circuit or the gate oxide film of the MOS transistor may be broken. This phenomena is induced because the junction in the device is so shallow owing to the horizontal arrangement of the horizontal bipolar transistor that the area through which the electric current passes is limited. Therefore, it is necessary to enlarge the area of the device in order to provide sufficient device ability.

When the vertical bipolar transistor is used as the electrostatic discharge protection device of the bipolar process (iii), the device is in the state of avalanche breakdown until transistor function and snap-back occur. The region having the avalanche breakdown is limited to the diffusion edge where the electric field is concentrated and a current density is very high. Accordingly, the transistor is heated up at the diffusion edge and the device may be broken.

SUMMARY OF THE INVENTION

The present invention provides a first semiconductor device having an electrostatic discharge protection device and at least one accompanying device selected from the group comprising of a N or P channel MOS transistor, CMOS, bipolar transistor and BiCMOS, in which the electrostatic discharge protection device comprises a vertical type bipolar transistor including, a semiconductor substrate, an epitaxial layer laminated on the semiconductor substrate, a buried collector of a first conductivity type which is formed of the semiconductor substrate or which is formed from the surface of the semiconductor substrate to the epitaxial layer, a base of a second conductivity type which is a lightly doped well and formed on the epitaxial layer, and an emitter of the first conductivity type and formed on the surface layer of the base of the second conductivity type; and in which the base is adapted to have impurity concentration and depth so that a punch-through is generated between the emitter and the collector of the electrostatic discharge protection device when a voltage higher than the operation voltage of the accompanying device or a voltage lower than the ground voltage is applied between the emitter and the collector, the base and the emitter being shorted with each other.

The present invention also provides a second semiconductor device having an electrostatic discharge protection device the same as the above electrostatic discharge protection device except for further comprising;

a collector contact diffusion region of the first conductivity type formed on the surface of at least a part of a collector diffusion region of the first conductivity type which contacts with the buried collector;

a highly doped diffusion layer of the second conductivity type formed in the base, which contacts with the collector contact diffusion region.

The present invention further provides a third semiconductor device having an electrostatic discharge protection device and at least one accompanying device selected from the group comprising of a N or P channel MOS transistor, CMOS, bipolar transistor and BiCMOS, in which the electrostatic discharge protection device comprises a vertical type bipolar transistor including, a semiconductor substrate, an epitaxial layer laminated on the semiconductor substrate, a buried collector of a first conductivity type which is formed of the semiconductor substrate or which is formed from the surface of the semiconductor substrate to the epitaxial layer, a base of a second conductivity type which is a lightly doped well and formed on the epitaxial layer, an emitter of the first conductivity type and formed on the surface layer of the base of the second conductivity type and a collector contact diffusion region formed on the surface of at least a part of a collector diffusion region of the first conductivity type in contact with the buried collector which include a collector sinker region of the first conductivity type;

the base comprising a highly doped diffusion layer of the second conductivity type, which contacts with at least the collector contact diffusion region or the collector sinker region; and in which the base is adapted to have impurity concentration and depth so that a punch-through is generated between the emitter and the collector of the electrostatic discharge protection device when a voltage higher than the operation voltage of the accompanying device or a voltage lower than the ground voltage is applied between the emitter and the collector; the base and the emitter being shorted with each other.

In other words, the object of the present invention is to provide a semiconductor device having an electrostatic discharge protection device of which function is improved without increasing manufacturing steps in the process of MOS, BiCMOS, bipolar transistor and the like.

The present invention provides a first method for manufacturing a semiconductor device having an electrostatic discharge protection device and at least one first conductivity type channel MOS transistor, in which the electrostatic discharge protection device comprises a vertical first/second/first conductivity type bipolar transistor (A) including, a semiconductor substrate, an epitaxial layer laminated on the semiconductor substrate, a buried collector of a first conductivity type which is formed of the semiconductor substrate or which is formed from the surface of the semiconductor substrate to the epitaxial layer, a base of a second conductivity type which is a lightly doped well and formed on the epitaxial layer, and an emitter of the first conductivity type and formed on the surface layer of the base of the second conductivity type; and in which the base is adapted to have impurity concentration and depth so that a punch-through is generated between the emitter and the collector of the electrostatic discharge protection device when a voltage higher than the operation voltage of the accompanying device or a voltage lower than the ground voltage is applied between the emitter and the collector, the base and the emitter being shorted with each other, which comprises the steps in which:

(i) a lightly doped well of the second conductivity type is formed as a MOS transistor formation region, and simultaneously the base of the second conductivity type of the electrostatic discharge protection device is formed; and (ii) source/drain regions of the first conductivity type is formed in the lightly doped well of the MOS transistor formation region, and simultaneously the emitter of the first conductivity type is formed in the base of the electrostatic discharge protection device.

The present invention also provides a second method for manufacturing a semiconductor device having an electrostatic discharge protection device and at least one second conductivity type channel MOS transistor, in which the electrostatic discharge protection device comprises a vertical first/second/first conductivity type bipolar transistor (A), which comprises the steps in which:

(i) the lightly doped well of the first conductivity type is formed as a MOS transistor formation region, and simultaneously the collector diffusion region of the first conductivity type of the electrostatic discharge protection device is formed, after or before the base of the second conductivity type of the electrostatic discharge protection device is formed; and (ii) source/drain regions of the second conductivity type is formed in the lightly doped well of the MOS transistor formation region, and simultaneously the base contact diffusion region of the second conductivity type is formed in the base.

The present invention further provides a third method for manufacturing a semiconductor device having an electrostatic discharge protection device and at least one first/second/first conductivity type bipolar transistor, in which the electrostatic discharge protection device comprises a vertical first/second/first conductivity type bipolar transistor (A), which comprises the steps in which:

(i) a lightly doped well of the second conductivity type is formed as a device isolation between the bipolar transistor and electrostatic discharge protection device, and simultaneously the base of the second conductivity type of the electrostatic discharge protection device is formed; and (ii) a base of the second conductivity type of the bipolar transistor is formed, and then the emitters of the first conductivity type in the bases of both the bipolar transistor and the electrostatic discharge protection device are simultaneously formed.

The present invention provides a forth method for manufacturing a semiconductor device having an electrostatic discharge protection device and BiCMOS transistor, in which the electrostatic discharge protection device comprises vertical first/second/first conductivity type bipolar transistor (A), which comprises steps in which:

(i) a lightly doped well of the second conductive type as a first conductivity type channel MOS transistor formation region and a lightly doped well of the second conductivity type as a device isolation between the bipolar transistor and the electrostatic discharge protection device are formed, and simultaneously the base of the second conductivity type of the electrostatic discharge protection device is formed, after or before a lightly doped wells of the first conductive type are formed as a second conductivity type channel MOS transistor formation region, collector diffusion regions for both the bipolar transistor and the electrostatic discharge protection device;

(ii) the base of the second conductivity type of the bipolar transistor, and then source/drain regions of the first conductivity type for the first conductivity type channel MOS transistor and the emitters of the first conductivity type in the bases of both the bipolar transistor and the electrostatic discharge protection device are simultaneously formed; and (iii) source/drain regions of a second conductivity type channel MOS transistor and the base contact diffusion regions of the second conductivity type of both the bipolar transistor and the electrostatic discharge protection device are simultaneously formed.

The present invention provides a fifth method for manufacturing a semiconductor device having an electrostatic discharge protection device and at least one first conductivity type channel MOS transistor, in which the electrostatic discharge protection device comprises a vertical first/second/first conductivity type bipolar transistor (B) including, a semiconductor substrate, an epitaxial layer laminated on the semiconductor substrate, a buried collector of a first conductivity type which is formed of the semiconductor substrate or which is formed from the surface of the semiconductor substrate to the epitaxial layer, a base of a second conductivity type which is a lightly doped well and formed on the epitaxial layer, an emitter of the first conductivity type and formed on the surface layer of the base of the second conductivity type, a collector contact diffusion region of the first conductivity type on the surface of at least a part of a collector diffusion region of the first conductivity type which contacts with the buried collector, a highly doped diffusion layer of the second conductivity type formed in the base, which contacts with the collector contact diffusion region; and in which the base is adapted to have impurity concentration and depth so that a punch-through is generated between the emitter and the collector of the electrostatic discharge protection device when a voltage higher than the operation voltage of the accompanying device or a voltage lower than the ground voltage is applied between the emitter and the collector, the base and the emitter being shorted with each other, which comprises steps in which:

(i) a lightly doped well of the second conductivity type is formed as a MOS transistor formation region, and simultaneously the base of the second conductivity type of the electrostatic discharge protection device is formed;

(ii) the highly doped diffusion region of the second conductivity type is formed for preventing the reverse of the surface region of the lightly doped well for the MOS transistor formation region, and simultaneously the highly doped diffusion region of the second conductivity type for the electrostatic discharge protection device is formed in the base;

(iii) source/drain regions of the first conductivity type is formed in the lightly doped well for the MOS transistor formation region, and simultaneously the emitter of the first conductivity type is formed in the base of the electrostatic discharge protection device; and (iv) the collector contact diffusion region of the first conductivity type is formed so as to contact with the highly doped diffusion layer of the electrostatic discharge protection device.

The present invention provides a sixth method for manufacturing a semiconductor device having an electrostatic discharge protection device and at least one second conductivity type MOS transistor, in which the electrostatic discharge protection device comprises a vertical first/second/first conductivity type bipolar transistor (B), which comprises the steps in which:

(i) a lightly doped well of the first conductivity type is formed as a MOS transistor formation region, and simultaneously the collector diffusion region of the first conductivity type of the electrostatic discharge protection device is formed, after or before the base of the second conductivity type is formed for the electrostatic discharge protection device, and a lightly doped well of the second conductivity type is formed as a device isolation between the MOS transistor and the electrostatic discharge protection device;

(ii) the highly doped diffusion region of the second conductivity type is formed for preventing the reverse of the surface region of the lightly doped well of the second conductivity type, and simultaneously the highly doped diffusion region of the second conductivity type is formed in the base of the electrostatic discharge protection device is formed;

(iii) source/drain regions of the second conductivity type is formed in the lightly doped well for the MOS transistor formation region, and simultaneously a base contact diffusion region of the second conductivity type is formed in the base; and (iv) the collector contact diffusion region of the first conductivity type is formed so as to contact with the highly doped diffusion layer of the electrostatic discharge protection device.

The present invention provides a seventh method for manufacturing a semiconductor device having an electrostatic discharge protection device and at least one first/second/first conductivity type bipolar transistor, in which the electrostatic discharge protection device comprises a vertical first/second/first conductivity type bipolar transistor (C) including, a semiconductor substrate, an epitaxial layer laminated on the semiconductor substrate, a buried collector of a first conductivity type which is formed of the semiconductor substrate or which is formed from the surface of the semiconductor substrate to the epitaxial layer, a base of a second conductivity type which is a lightly doped well and formed on the epitaxial layer, and an emitter of the first conductivity type and formed on the surface layer of the base of the second conductivity type, a collector sinker region of the first conductivity type in a collector diffusion region of the first conductivity type which contacts with the buried collector or a region bridging from the base to collector diffusion region, a collector contact diffusion region of the first conductivity type on the surface of the collector sinker region, a highly doped diffusion layer of the second conductivity type formed in the base, which contacts with at least the collector contact diffusion region or the collector sinker region; and in which the base is adapted to have impurity concentration and depth so that a punch-through is generated between the emitter and the collector of the electrostatic discharge protection device when a voltage higher than the operation voltage of the accompanying device or a voltage lower than the ground voltage is applied between the emitter and the collector, the base and the emitter being shorted with each other, which comprises the steps in which:

(i) a lightly doped well of the second conductivity type is formed as a device isolation between the bipolar transistor and electrostatic discharge protection device, and simultaneously the base of the second conductivity type of the electrostatic discharge protection device is formed after or before lightly doped wells of the first conductivity type are formed as collector diffusion regions of both the bipolar transistor and the electrostatic discharge protection device;

(ii) the highly doped diffusion region of the second conductivity type is formed for preventing the reverse of the surface region of the lightly doped well between the bipolar transistor and electrostatic discharge protection device, and simultaneously the highly doped diffusion region of the second conductivity type is formed in the base of the electrostatic discharge protection device is formed;

(iii) a plug diffusion layer is formed in the collector diffusion region or a region bridging from the base to the collector diffusion region of the bipolar transistor and simultaneously a plug diffusion layer is formed in the collector diffusion region or a region bridging from the base to the collector diffusion region of the electrostatic discharge protection device;

(iv) a base of the second conductivity type of the bipolar transistor is formed, and then the emitters of the first conductivity type in the bases of both the bipolar transistor and the electrostatic discharge protection device are simultaneously formed; and (v) the collector contact diffusion region is formed in the plug diffusion layer of the first conductivity type whereby a collector sinker region is formed, so that the highly doped diffusion layer of the electrostatic discharge protection device is in contact with at least the collector contact diffusion region or the collector sinker region.

The present invention provides an eighth method for manufacturing a semiconductor device having an electrostatic discharge protection device and BiCMOS transistor, in which the electrostatic discharge protection device comprises vertical first/second/first conductivity type bipolar transistor (C), which comprises steps in which:

(i) lightly doped wells of the second conductive type are formed as a first conductivity type channel MOS transistor formation region, as a device isolation for a second conductivity type channel MOS transistor and as a device isolation between the bipolar transistor and electrostatic discharge protection device, and simultaneously the base of the second conductivity type of the electrostatic discharge protection device is formed, after or before a lightly doped wells of the first conductive type are formed as a second conductivity type channel MOS transistor formation region, collector diffusion regions for the bipolar transistor and electrostatic discharge protection device;

(ii) highly doped diffusion regions of the second conductivity type are formed for preventing the reverse of the surface region of the lightly doped wells for the device isolations of the between bipolar transistor and electrostatic discharge protection device and for the first conductivity type channel MOS transistor, a highly doped diffusion region of the second conductivity type is formed for preventing the reverse of the surface region of the lightly doped well of the second conductivity type as the first conductivity type channel MOS transistor formation region, and simultaneously the highly doped diffusion region of the second conductivity type is formed in the base of the electrostatic discharge protection device is formed;

(iii) a plug diffusion layer is formed in the collector diffusion region or a region bridging from the base to the collector diffusion region of the bipolar transistor and simultaneously a plug diffusion layer is formed in the collector diffusion region or a region bridging from the base to the collector diffusion region of the electrostatic discharge protection device;

(iv) the base of the second conductivity type of the bipolar transistor is formed, and then source/drain regions of the first conductivity type channel MOS transistor and the emitters of the first conductivity type in the bases of both the bipolar transistor and the electrostatic discharge protection device are simultaneously formed;

(v) source/drain regions of a second conductivity type channel MOS transistor and the base contact diffusion regions of the second conductivity type of both the bipolar transistor and the electrostatic discharge protection device are simultaneously formed; and (vi) the collector contact diffusion region is formed in the plug diffusion layer of the first conductivity type whereby a collector sinker region is formed, so that the highly doped diffusion layer of the electrostatic discharge protection device is in contact with at least the collector contact diffusion region or the collector sinker region.

BRIEF DESCRIPTION OF THE DRAWINGS

FIG. 11 is a graph showing a relationship between collector voltage and collector electric current of an electrostatic discharge protection device of Examples 1 to 5.

FIG. 12 is an equivalent circuit showing a main part of a semiconductor device of the present invention.

FIG. 29 is a plan view showing an arrangement of a diffusion region in an electrostatic discharge protection device of a semiconductor device of Example 3.

FIG. 30 is a graph showing a concentration profile beneath an emitter of an electrostatic discharge protection device of Examples 3 and 8.

FIG. 39 is a plan view showing an arrangement of a diffusion region of an electrostatic discharge protection device of Examples 4 and 5.

FIG. 40 is a graph showing a concentration profile beneath an emitter of an electrostatic discharge protection device of Examples 4, 5, 9 and 10.

FIGS. 104 to 109 are a sectional view of another conventional semiconductor device in each step of a still another method for manufacturing the same.

FIG. 110 is a plan view of another conventional semiconductor device shown in FIG. 109.

FIG. 111 is a graph showing a concentration profile beneath an emitter of an electrostatic discharge protection device of a conventional semiconductor device.

FIG. 112 is a graph showing a relationship between a collector voltage and a collector electric current of an electrostatic discharge protection device of a conventional semiconductor device.

PREFERRED EMBODIMENT OF THE INVENTION

Figure 1:
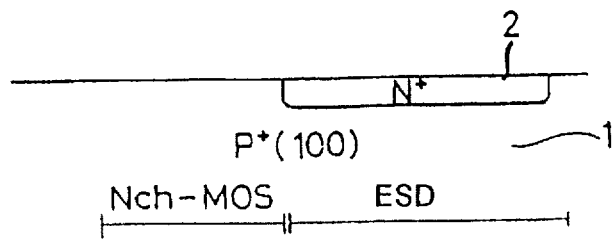
FIGS. 1 to 4 are a sectional view of a semiconductor device in each step of a first half of manufacturing process of Examples 1 of the present invention.

The semiconductor device of the present invention comprises at least N channel MOS transistor (NMOS) or P channel MOS transistor (PMOS), CMOS, bipolar transistor or, BiCMOS and the like, and a vertical type bipolar transistor as a electrostatic discharge protection device (ESD) which includes a buried collector of the first conductivity type, a base of the second conductivity type and a emitter of the first conductivity type. The electrostatic discharge protection device may preferably comprise a collector diffusion region, a collector contact diffusion region of the first conductivity type, and may further comprise a collector sinker region of the first conductivity type.

The buried collector of the first conductivity type in the electrostatic discharge protection device may be the semiconductor substrate itself or can be formed by forming a buried diffusion region by growing a epitaxial layer after forming a highly doped region on the semiconductor substrate. The impurity concentration of the buried collector is preferably about $1 \times 10^{18}$ cm$^{-3}$ to $4 \times 10^{19}$ cm$^{-3}$.

The base of the second conductivity type may be formed in the epitaxial layer and is adapted to have the impurity concentration and the depth so that a punch-through is generated between the emitter and the collector of the electrostatic discharge protection device when a voltage higher than the operation voltage of the accompanying device or lower than the ground voltage is applied between the emitter and the collector. For example, the impurity concentration of the base of the second conductivity type is preferably about $1 \times 10^{16}$ cm$^{-3}$ to $3 \times 10^{16}$ cm$^{-3}$ and the depth thereof is preferably about 0.8 to 2.3 microns. The base of the second conductivity type may comprise a base contact diffusion region. The impurity concentration of the base contact diffusion region is preferably greater than that of the base, for example, about $3 \times 10^{19}$ cm$^{-3}$ to $8 \times 10^{19}$ cm$^{-3}$.

The emitter of the first conductivity type is formed in the base of the second conductivity type. The emitter of the first conductivity type is preferably about $1 \times 10^{20}$ cm$^{-3}$ to $4 \times 10^{20}$ cm$^{-3}$.

When the electrostatic discharge protection device comprises the collector diffusion region of the first conductivity type, it is preferable to form it adjacent to the base of the second conductivity type. In that case, the impurity concentration of the collector diffusion region is preferably about $1 \times 10^{16}$ cm$^{-3}$ to $3 \times 10^{16}$ cm$^{-3}$ and the depth thereof is such that the collector diffusion region contacts the buried collector underneath thereof.

The collector contact diffusion region of the first conductivity type may be formed in order to obtain ohmic contact with a collector electrode in the collector diffusion region.

The collector sinker region of the first conductivity type having an impurity concentration of about $2 \times 10^{19}$ cm$^{-3}$ to $5 \times 10^{19}$ cm$^{-3}$ may be formed in the collector diffusion region in order to reduce a resistance between the collector electrode and the buried collector. The collector sinker region may be formed almost similar to the depth of the base of the second conductivity type in the collector diffusion region. The following is the reason for forming the collector sinker region as such; when impurities are diffused deeply by thermal treatment and the like, the impurities are diffused not only in the vertical direction but also in the horizontal direction to the surface of the substrate, which causes a problem for miniaturizing the device.

According to the electrostatic discharge protection device described above, punch-through breakdown occurs between the collector and emitter, and triggers to function transistor thereby inducing snap-back. A depletion layer is extended inside of the base and under the emitter region, and the concentration of electric field is prevented, so that electric current is not concentrated. As a result, a device is prevented from destroying caused by heat generation such as avalanche breakdown trigger.

Figure 93:
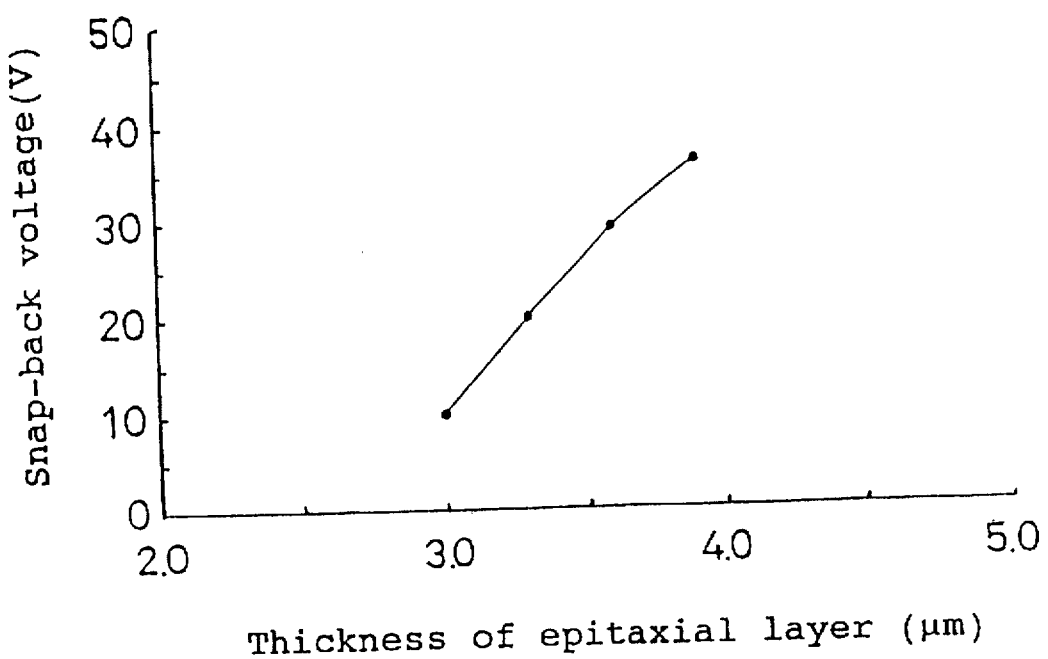
FIG. 93 is a graph showing a relationship between a thickness of an epitaxial layer and snap-back voltage of a semiconductor device of the present invention.
Figure 94:
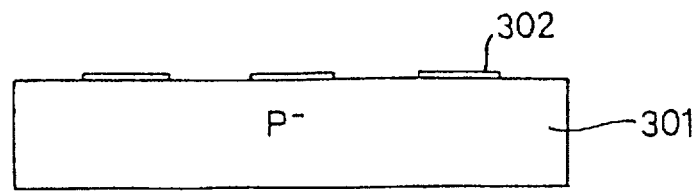
FIGS. 94 to 97 are a sectional view of a conventional semiconductor device in each step of a method for manufacturing the same.
Figure 95:
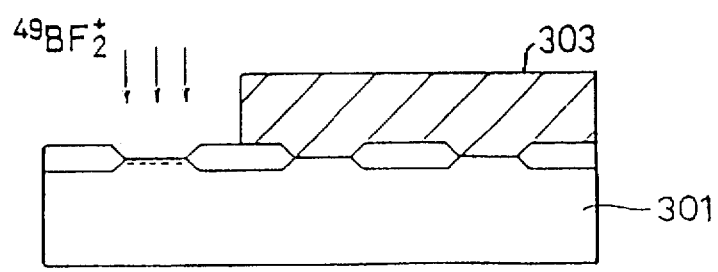
Figure 96:
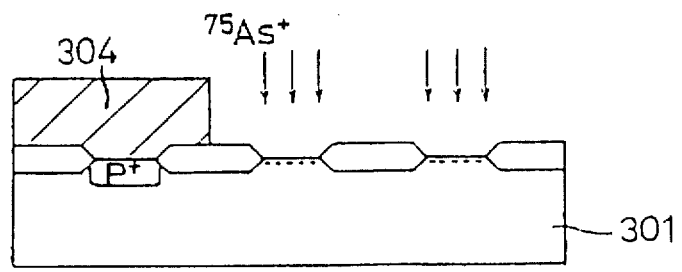
Figure 97:
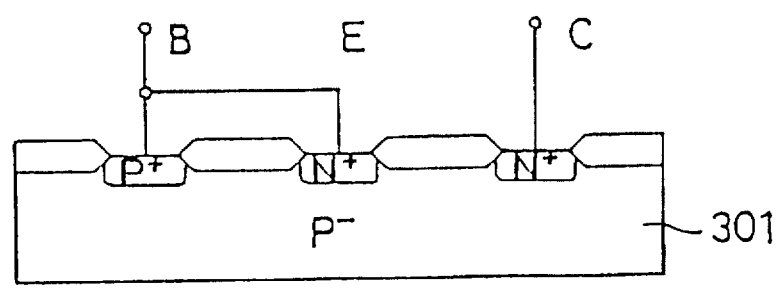
Figure 98:
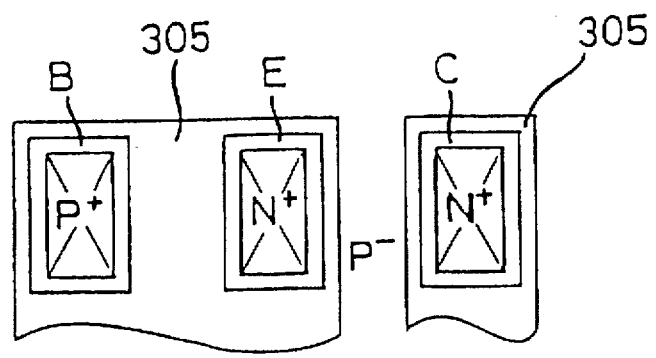
FIG. 98 is a plan view of the conventional semiconductor device shown in FIG. 97.
Figure 99:
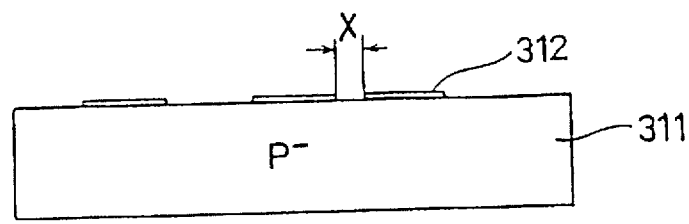
FIGS. 99 to 102 are a sectional view of another conventional semiconductor device in each step of another method for manufacturing the same.
Figure 100:
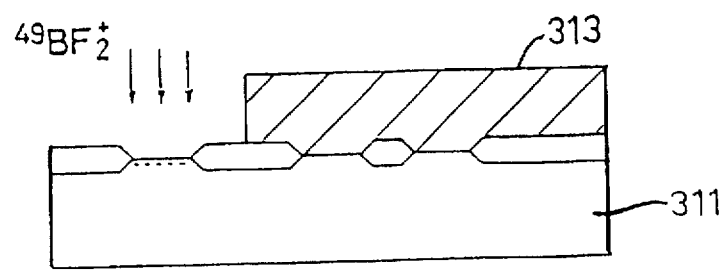
Figure 101:
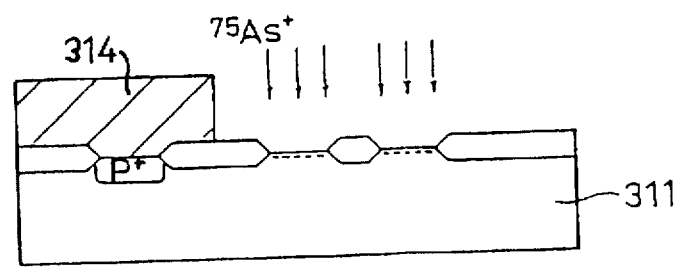
Figure 102:
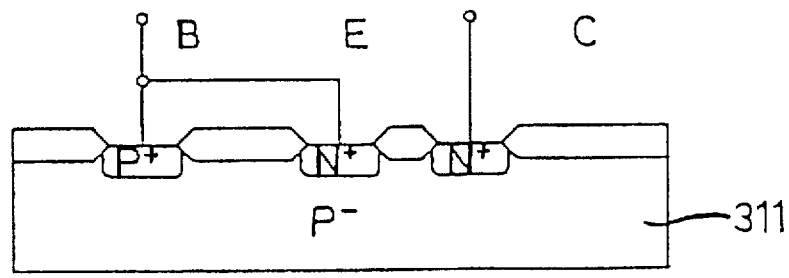
Figure 103:
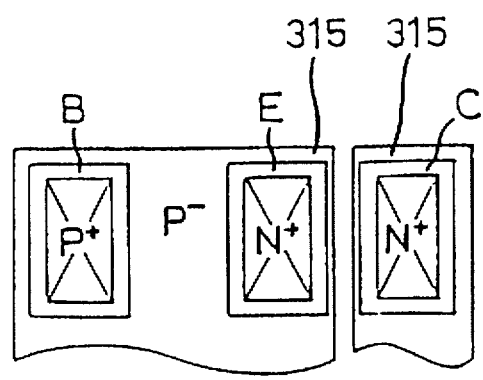
FIG. 103 is a plan view of another conventional semiconductor device shown in FIG. 102.
Figure 104:
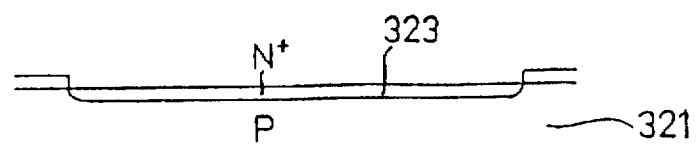
Figure 105:
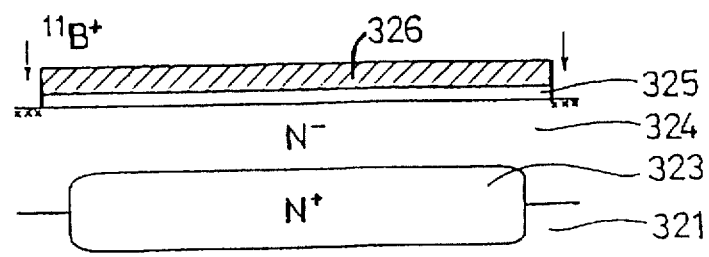
Figure 106:
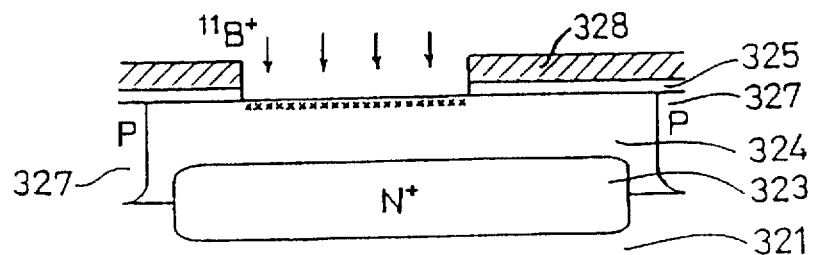
Figure 107:
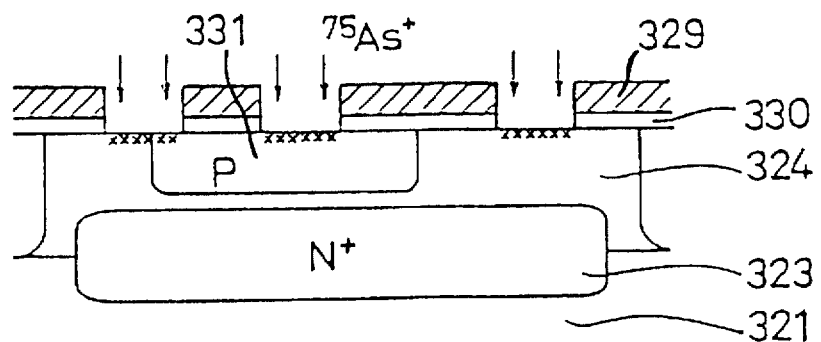
Figure 108:
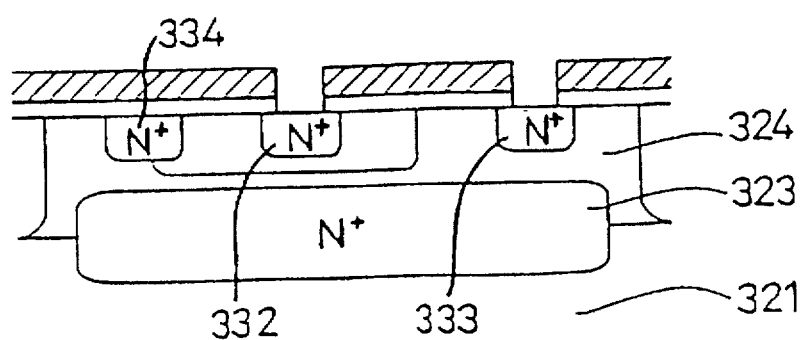

However, the thickness of the epitaxial layer for forming the base of the second conductivity type varies by ±5% with respect to the desired thickness. Thus, in the manufacturing process, if the epitaxial layer is formed to a thickness thicker than the desired thickness, the punch-through breakdown voltage is shifted to a higher voltage as shown FIG. 93. Accordingly, when the punch-through breakdown voltage is shifted to a higher voltage, excessive voltage is applied to the inner circuit of the semiconductor device.

The semiconductor device of the present invention comprises an electrostatic discharge protection device of which avalanche breakdown functions as a trigger of snap-back in order to compensate excessive voltage applied to the inner circuit even when a punch-through breakdown voltage is varied.

When the electrostatic discharge protection device is expected to cause avalanche breakdown, the electrostatic discharge protection device further comprises a collector contact diffusion region of the first conductivity type, a highly doped diffusion layer of the second conductivity type and a collector sinker region of the first conductivity type. In this case, the collector contact diffusion region and the collector sinker region may be formed in the collector diffusion region or in a region bridging from the collector diffusion region to the base. The highly doped diffusion region may be formed on the surface of the base of the second conductivity type and located beneath the field oxide film. The impurity concentration of the highly doped diffusion region of the second conductivity type is preferably about $6\times10^{16}$ to $2\times10^{17}$. The depth thereof is not specifically limited, but it is preferable to have a depth which is similar to that of the layer for preventing the reverse of the surface layer of the device isolation region and the like. One end of the highly doped diffusion region preferably contacts with at least the collector contact diffusion region or the collector sinker region, or with both of the collector contact diffusion region and collector sinker region.

According to the electrostatic discharge protection device described above, avalanche breakdown occurs between the collector contact diffusion region or collector sinker region, and highly doped diffusion region before snap-back occurred triggered by the punch-through, and triggers to function transistor, thereby inducing snap-back. As a result, a device is prevented from destroying.

Incidentally, the impurity concentration of the highly doped diffusion region varies by ±5% with respect to the desired concentration according to the variance of implanting dose. However, the shift amount of the avalanche breakdown voltage caused by the variance of the impurity concentration is considerably smaller than the shift amount of the punch-through caused by the variance of the film thickness of the epitaxial layer, so that the breakdown can be generated at the desired voltage.

According to the method of the present invention, the device can be formed in the process for forming the PMOS, NMOS, CMOS, bipolar transistor and BiCMOS which are included in the device without adding a specific step. Moreover, a device isolation may be formed between the electrostatic discharge protection device and the above device utilizing a lightly doped well and the like.

The present invention is described in detail with reference to examples as follows. However, it is not intended to limit the scope of the invention thereto.

EXAMPLE 1

Example 1 relates to a MOS type semiconductor device comprising a vertical type bipolar transistor as an ESD which causes snap-back triggered by punch-through.

As shown in FIG. 1, a $P^+$ type silicon substrate 1 (concentration about $2\times10^{18}$ cm$^{-3}$) is used. Firstly, SOG including antimony (Sb) (not shown) is applied on the region for the ESD. Then, the substrate is subjected to thermal treatment at 1,150° C. for 600 minutes and antimony is driven in the region, thereby forming an $N^+$ diffusion region 2.

Figure 2:
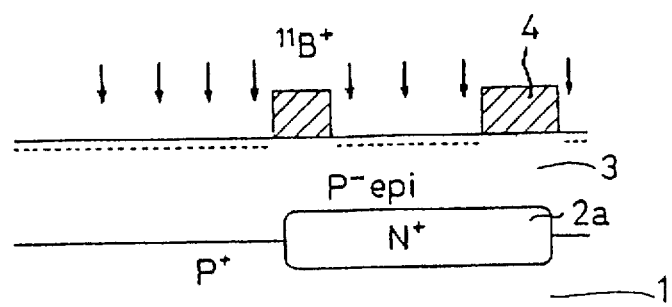

Subsequently, as shown in FIG. 2, a $P^-$ epitaxial layer 3 is grown with a thickness of about 3.1 microns and a buried collector 2a is formed. Then, in order to obtain a $P^-$ well having a relatively high resistivity which works as a base for the ESD and an NMOS formation region, a mask 4 is formed with a desired shape by photolithographic process and ions ($^{11}B^+$: 150 KeV, $7\times10^{12}$ cm$^{-2}$) are implanted.

Figure 3:
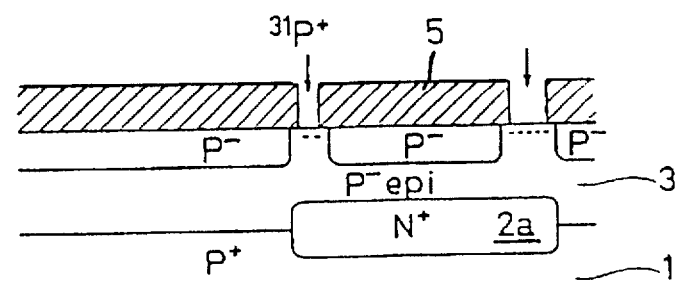

As shown in FIG. 3, a mask 5 is formed with a desired shape by photolithographic process and ions ($^{31}P^+$: 150 KeV, $2\times10^{12}$ cm$^{-2}$) are implanted for forming an $N^-$ well which works as a collector diffusion region of the ESD.

Figure 4:
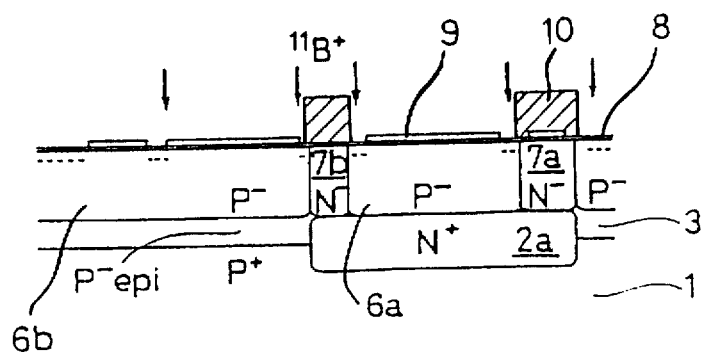

Then, as shown in FIG. 4, the silicon substrate 1 is subjected to thermal treatment at 1,150° C. for 100 minutes, and $^{11}B^+$ and $^{31}P^+$ are driven in the desired regions, respectively, to form a $P^-$ well comprising a base 6a for the ESD and lightly doped well 6b for the NMOS formation region and an $N^-$ well comprising collector diffusion region 7a and 7b. In that case, the surface impurity concentration of the $P^-$ well which comprises the base 6a of the ESD and the lightly doped well 6b for the NMOS formation region is $2\times10^{16}$ cm$^{-3}$ and the diffusion depth thereof is about 1.5 microns which corresponds to the $N^+$ buried collector 2a (about $2\times10^{19}$ cm$^{-3}$). Further, an SiO$_2$ film 8 is formed with a relatively thin thickness (about 25 nm) by thermal oxidation. A nitride film 9 is formed with a thickness of about 120 nm on the SiO$_2$ film 8 by CVD method and the nitride film 9 is etched so as to leave it only on a place where an active region is to be formed. In order to prevent the $P^-$ well surface from reversing, a mask 10 is formed with a desired shape by photolithographic process and ions ($^{11}B^+$: 30 KeV, $5\times10^{13}$ cm$^{-2}$) are implanted.

Figure 5:
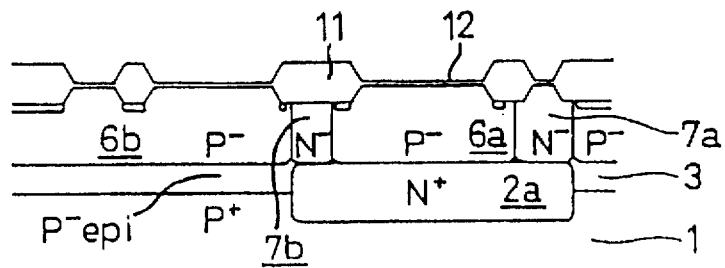
FIGS. 5 to 8 are a sectional view of a semiconductor device in each step of a second half of manufacturing process of Example 1 of the present invention.

As shown in FIG. 5, a field oxide film 11 is formed with a thickness of 600 nm as a device isolation and a gate oxide film 12 is formed with a thickness of about 25 nm.

Figure 6:
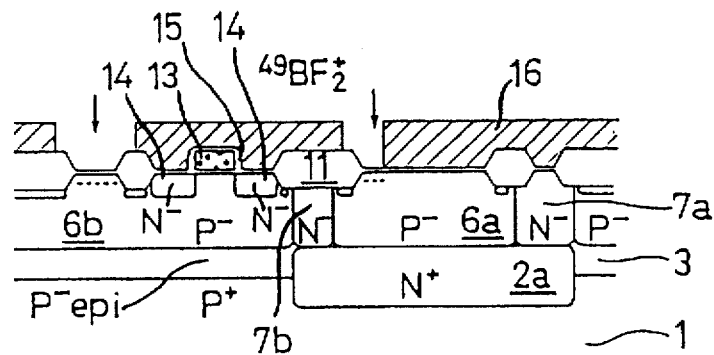

As shown in FIG. 6, a gate electrode 13 for the NMOS is formed of $N^+$ polysilicon having a thickness of about 300 nm and an $N^-$ diffusion region 14 of the NMOS is formed. A side wall spacer 15 is formed on the gate electrode 13. A mask 16 is formed with a desired shape by photolithographic process and ions ($^{49}BF_2^+$: 50 KeV, $5\times10^{15}$ cm$^{-2}$) are implanted into regions to be a base contact diffusion region of the ESD and a well contact diffusion region of the NMOS.

Figure 7:
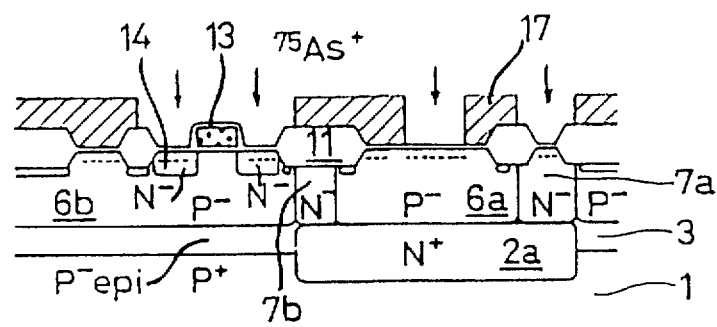

Next, as shown in FIG. 7, a mask 17 is formed with a desired shape by photolithographic process and ions ($^{75}As^+$: 80 KeV, $5\times10^{15}$ cm$^{-2}$) are implanted into regions to be an emitter and collector contact diffusion region of the ESD and source/drain region (about $2\times10^{20}$ cm$^{-3}$) for NMOS.

Figure 8:
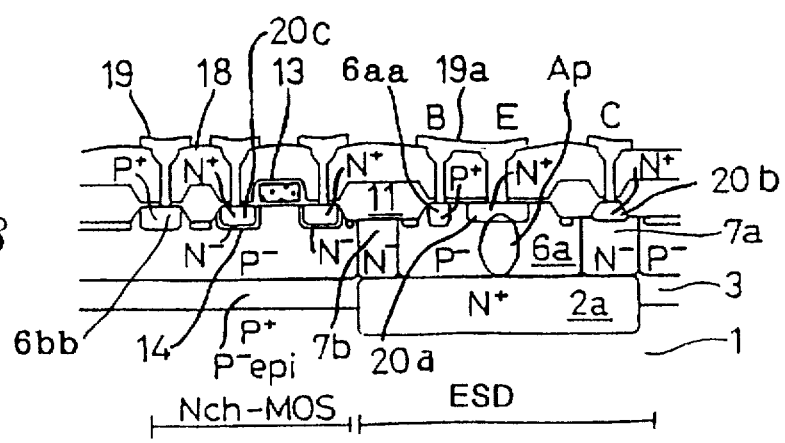

Further, as shown in FIG. 8, after forming the base contact diffusion region 6aa, the emitter 20a and collector contact diffusion region 20b for the ESD and well contact diffusion region 6bb, source/drain region 20c for the NMOS having LDD structure, an NSG/BPSG film 18 is formed with a thickness of 100/700 nm on the entire surface of the substrate 1, and a contact hole is formed through the NSG/BPSG film 18 provided on the emitter 20a, the collector contact diffusion region 20b, the base contact diffusion region 6aa, well contact diffusion region 6bb and the source/drain region 20c. Then, a metal wiring 19 (Al-Si: 1.1 microns) is formed. The emitter 20a and base 6a of the ESD are shorted with a metal 19a.

Figure 9:
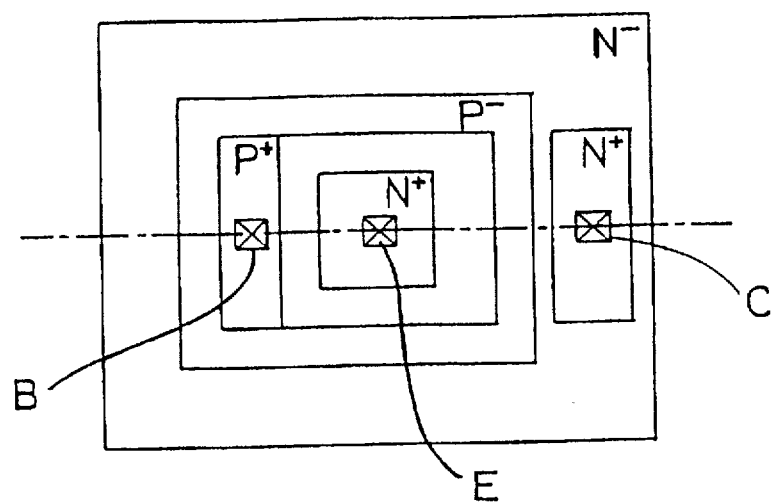
FIG. 9 is a plan view for showing an arrangement of a diffusion region in an electrostatic discharge protection device of Examples 1 and 2.
Figure 10:
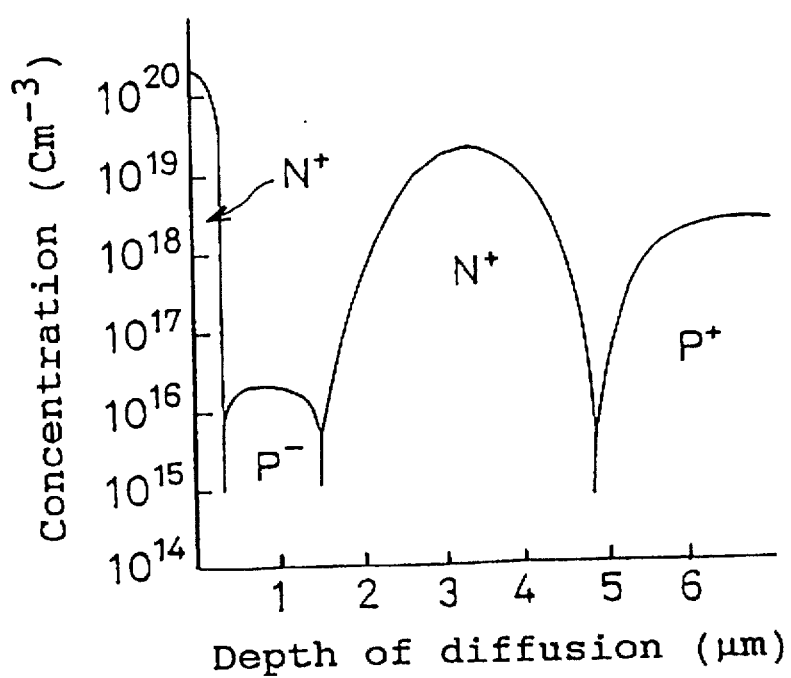
FIG. 10 is a graph showing a concentration profile beneath an emitter of an electrostatic discharge protection device of Examples 1, 2, 6 and 7.

FIG. 9 shows a plan view of thus formed the ESD in the semiconductor device and FIG. 10 shows a concentration profile beneath the emitter of the ESD.

When a reverse bias is applied to the collector of the bipolar transistor which works as ESD, punch-through occurs in the emitter and buried collector at about 10 V (shown as region Ap in FIG. 8), whereby an electric current starts flowing. If the reverse bias is further applied, transistor functions and snap-back occur at about 14V. As a result, the collector voltage decreases, so that the electric current increases further as shown in FIG. 11.

FIG. 12 is an equivalent circuit showing a part of a semiconductor device comprising a vertical type bipolar transistor as the ESD described above. In this device, when static electricity which is higher than $V_{DD}$ and does not cause breakdown on the GND side of the device occurs in $P_{ad}$, the static electricity can escape from $P_{ad}$ to $V_{DD}$; and when static electricity which is higher than $V_{DD}$ and causes breakdown on the GND side of the device occurs in Pad, the static electricity flows to GND. On the other hand, when static electricity which is lower than GND and does not cause breakdown on the $V_{DD}$ side of the device occurs in $P_{ad}$, the static electricity can escape from GND to $P_{ad}$; and when static electricity which is lower than GND and causes breakdown on the $V_{DD}$ side of the device occurs in $P_{ad}$, the electrostatics can escape from $V_{DD}$ to $P_{ad}$.

In this Example, both of the $N^+$ buried collector $2a$ and epitaxial layer 3 are employed, but the $N^+$ buried collector can be used by implanting with high energy without using epitaxial layer.

EXAMPLE 2

Example 2 relates to CMOS type semiconductor device comprising a vertical type bipolar transistor as an ESD which causes snap-back triggered by punch-through.

Figure 13:
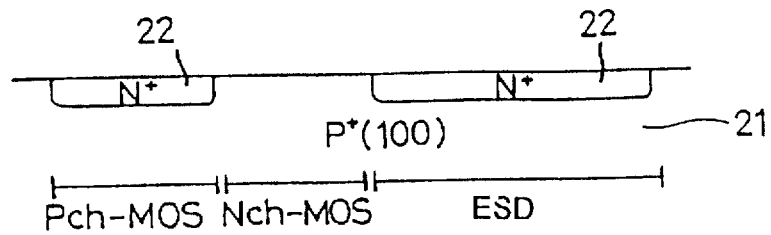
FIGS. 13 to 16 are a sectional view of a semiconductor device in each step of a first half of manufacturing process of Example 2.

As shown in FIG. 13, a $P^+$ type silicon substrate 21 is used. First, SOG is applied on the region for the ESD and a PMOS on the substrate in the same manner as Example 1. Then, the substrate is subjected to thermal treatment in the same manner as Example 1, thereby forming an $N^+$ diffusion region 22.

Figure 14:
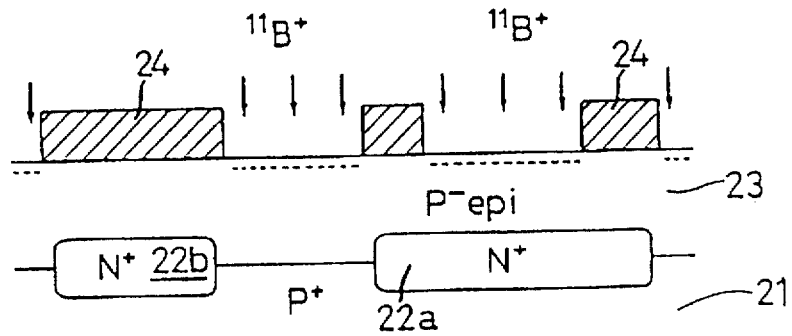

Subsequently, a $P^-$ epitaxial layer 23 is grown with a thickness of about 3.1 microns and a buried collector $22a$ is formed in the same manner as shown Example 1 in FIG. 14. Then, a mask 24 is formed with a desired shape and $^{11}B^+$ ions are implanted for obtaining a $P^-$ well having a relatively high resistivity which comprises a base for the ESD and an NMOS formation region.

Figure 15:
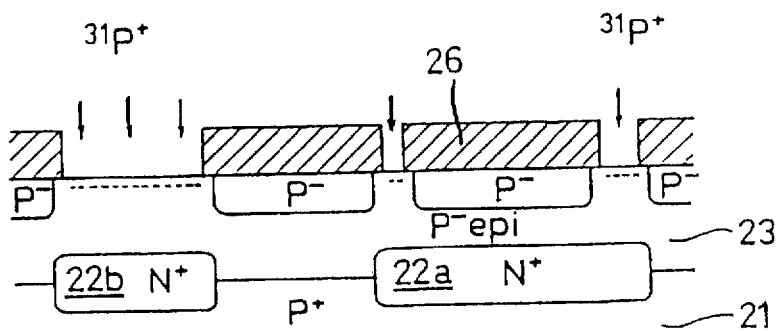

As shown in FIG. 15, a mask 26 is formed in the same manner as Example 1 and $^{31}P^+$ ions are implanted for forming a collector diffusion region for the ESD, and $N^-$ well which is used as an PMOS formation region.

Figure 16:
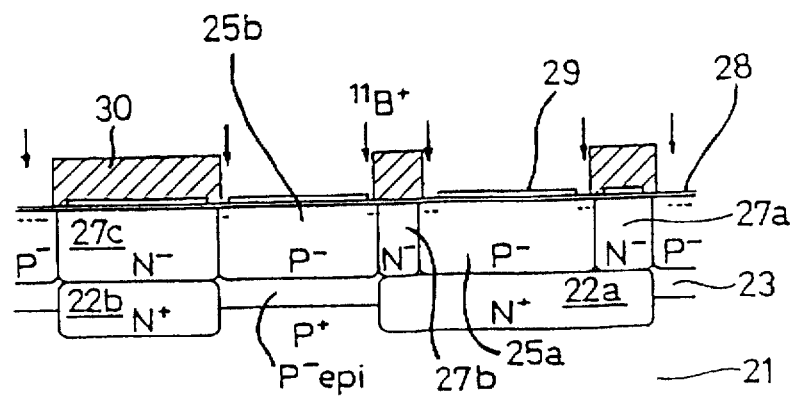

Then, as shown in FIG. 16, a $P^-$ well comprising a base $25a$ and a lightly doped well $25b$ for an NMOS formation region, an $N^-$ well comprising collector diffusion region $27a$, $27b$ and a lightly doped well $27c$ for the PMOS formation region are formed in the same manner as Example 1. In that case, the base $25a$ and lightly doped well $25b$ of the NMOS formation region which have a concentration of about $2 \times 10^{16}$ cm$^{-3}$ and a diffusion depth of about 1.5 microns. Further, an $SiO_2$ film 28 and a nitride film 29 are formed in the same manner as Example 1 and the nitride film 29 is etched to have a desired shape. In order to prevent the reverse of the $P^-$ well (a base $25a$ and a lightly doped well $25b$) surfaces, a mask 30 is formed and $^{11}B^+$ ions are implanted in the same manner as Example 1.

Figure 17:
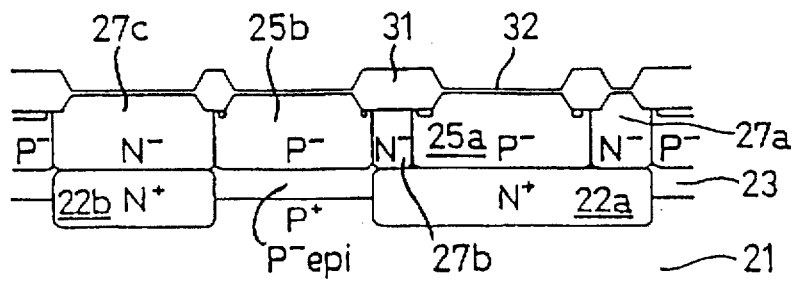
FIGS. 17 to 20 are a sectional view of a semiconductor device in each step of a second half of manufacturing process of Example 2.

Next, as shown in FIG. 17, a field oxide film 31 is formed as a device isolation and a gate oxide film 32 is formed.

Figure 18:
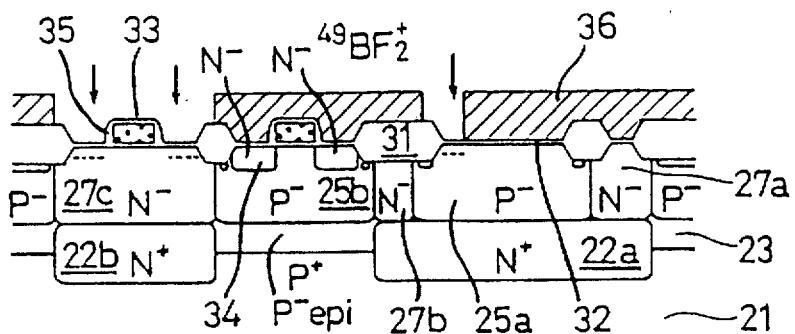

As shown in FIG. 18, a gate electrode 33 of the NMOS and PMOS and an $N^-$ diffusion region 34 of the NMOS are formed. Subsequently, a side wall spacer 35 is formed on the gate electrode 33. A mask 36 is formed and $^{49}BF_2^+$ ions are implanted into regions to be a base contact diffusion region of the ESD, source/drain regions of the PMOS and a well contact diffusion region of NMOS (not shown in FIG. 18) in the same manner as Example 1.

Figure 19:
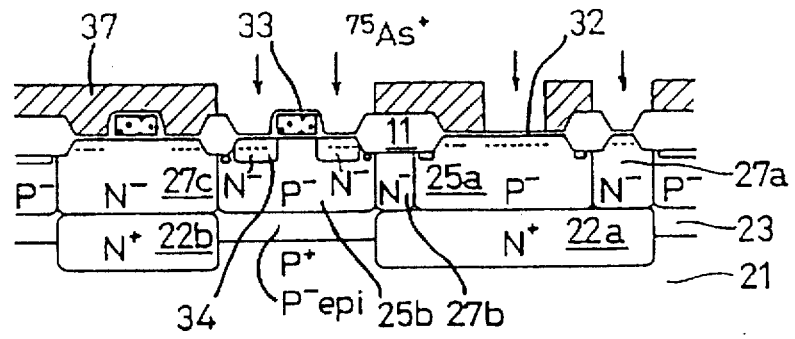

Next, as shown in FIG. 19, in order to form an emitter and a collector contact diffusion region in the ESD, a source/drain region for the NMOS (about $2 \times 10^{20}$ cm$^{-3}$) and a well contact diffusion region of the PMOS (not shown in FIG. 19), a mask 37 is formed and $^{75}As^+$ ions are implanted in the same manner as Example 1.

Figure 20:
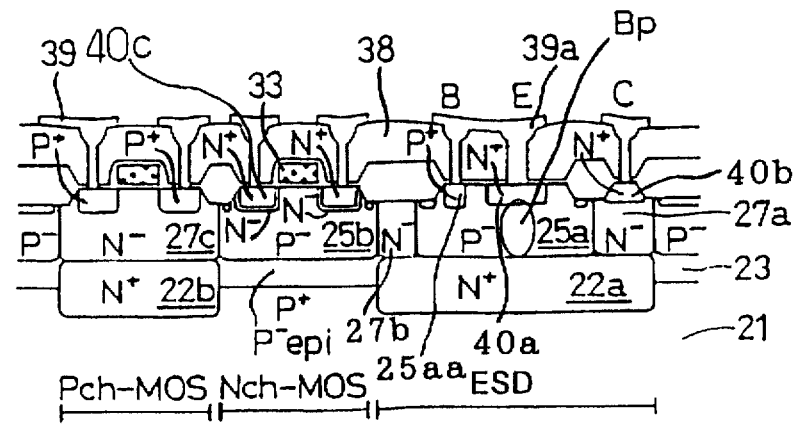

Further, as shown in FIG. 20, after forming the base contact diffusion region $25aa$ and source/drain regions of the PMOS, and the emitter $40a$ and collector contact diffusion region $40b$ for the ESD and source/drain region $40c$ for the NMOS having LDD structure, an NSG/BPSG film 38 is formed on the whole surface of the semiconductor substrate 21 and a metal wiring 39 is formed in the same manner as Example 1. Then, the emitter $40a$ and base $25a$ of the ESD are shorted with a metal $39a$.

The plan view of thus formed ESD in the semiconductor device is the same as FIG. 9 and a concentration profile beneath the emitter of the ESD is the same as FIG. 10.

When a reverse bias is applied to the collector of the bipolar transistor of this type which works as the ESD, punch-through occurs in a region shown as a region Bp in FIG. 20, whereby an electric current starts flowing. If the reverse bias is further applied, transistor functions and snap-back occur at about 14V. As a result, the collector voltage decreases, so that the electric current increases further as shown in FIG. 11.

FIG. 12 also shows an equivalent circuit of Example 2 showing a part of the semiconductor device comprising bipolar transistor of the ESD.

In this Example, both of the $N^+$ buried collector $22a$ and epitaxial layer 23 are employed, but $N^+$ buried collector can be also used by implanting with high energy without using epitaxial layer.

EXAMPLE 3

Example 3 relates to another CMOS type semiconductor device comprising a vertical type bipolar transistor as an ESD which causes snap-back triggered by punch-through.

Figure 21:
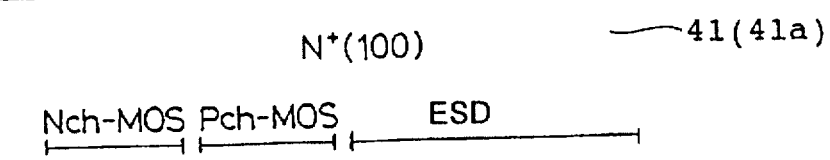
FIGS. 21 to 24 are a sectional view of a semiconductor device in each step of a first half of manufacturing process of Example 3.

As shown in FIG. 21, an $N^+$ type silicon substrate 41 (about $2 \times 10^{18}$ cm$^{-3}$) is used.

Figure 22:
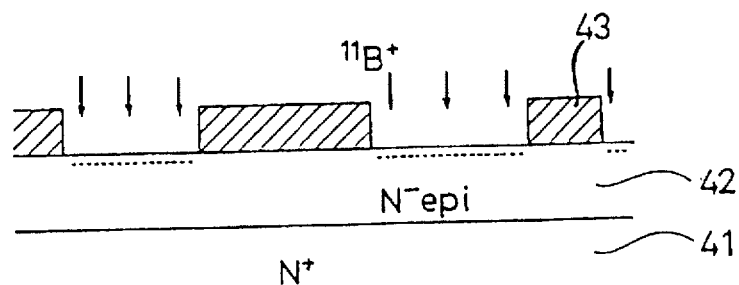

As shown in FIG. 22, an $N^-$ epitaxial layer 42 is grown with a thickness of about 3.1 microns on the substrate 41. A mask 43 is formed and $^{11}B^+$ ions are implanted in the same manner as Example 1 for obtaining a $P^-$ well having a relatively high resistivity which comprises a base of the ESD and an NMOS formation region.

Figure 23:
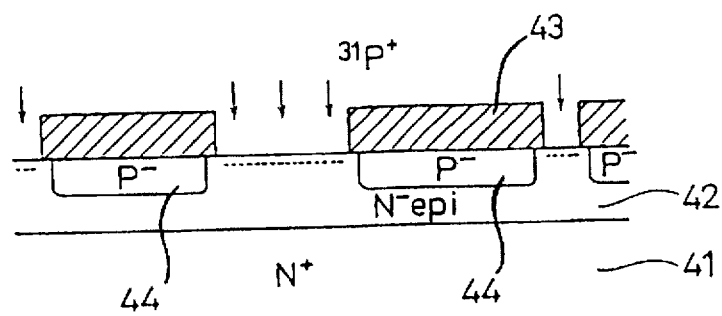

Subsequently, in order to form an $N^-$ well comprising a collector diffusion region for the ESD and a PMOS formation region, a mask 43 is formed and $^{31}P^+$ ions are implanted in the same manner as Example 1 as shown in FIG. 23.

Figure 24:
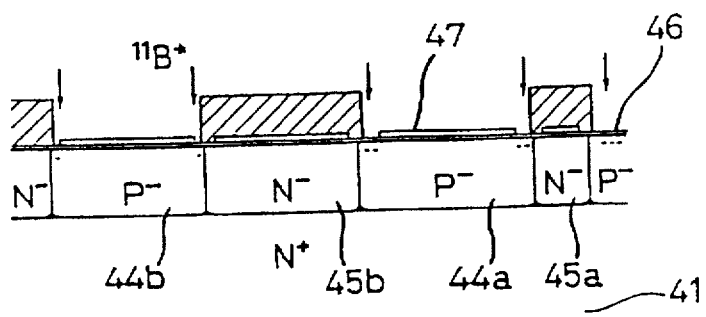

Then, in the same manner as Example 1, the resulting substrate is subjected to thermal treatment and $^{11}B^+$ and $^{31}P^+$ are driven into desired regions, respectively, thereby forming a $P^-$ well comprising a base $44a$ and a lightly doped well $44b$ of the NMOS formation region and an $N^-$ well comprising a collector diffusion region $45a$ and a lightly doped well $45b$ of the PMOS formation region as shown in FIG. 24. The ion concentration of $P^-$ well comprising the base $44a$ and lightly doped well $44b$ for the NMOS formation region is about $2 \times 10^{16}$ cm$^{-3}$ and a diffusion depth thereof is about 1.5 microns. Further, an $SiO_2$ film 46 and nitride film 47 are formed in the same manner as Example 1. After etching the films to give a desired shape, $^{11}B^+$ ions are implanted in the same manner of Example 1 for preventing the reverse of the $P^-$ well surface.

Figure 25:
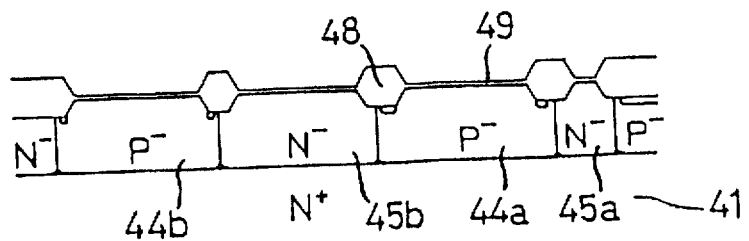
FIGS. 25 to 28 are a sectional view of a semiconductor device in each step of a second half of manufacturing process of Example 3.

Next, as shown in FIG. 25, a field oxide film 48 is formed as a device isolation. Further, a gate oxide film 49 is formed thereon.

Figure 26:
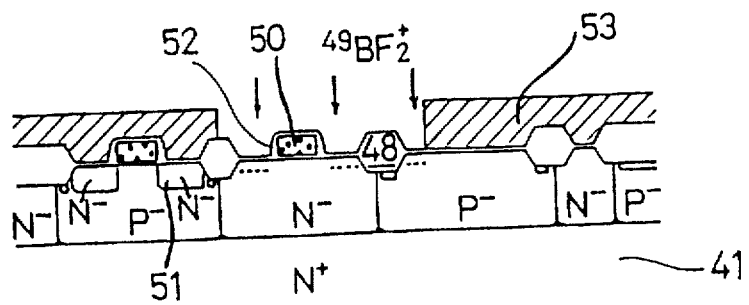

As shown in FIG. 26, a gate electrode 50 of the NMOS and PMOS and an $N^-$ diffusion region 51 of the NMOS are formed. Subsequently, after forming a side wall spacer 52 on the gate electrode 50, a mask 53 is formed and $^{49}BF_2^+$ ions are implanted the same manner as Example 1 into regions to be a base contact diffusion region of the ESD, source/drain regions of the PMOS and a well contact diffusion region of the NMOS (not shown in FIG. 26).

Figure 27:
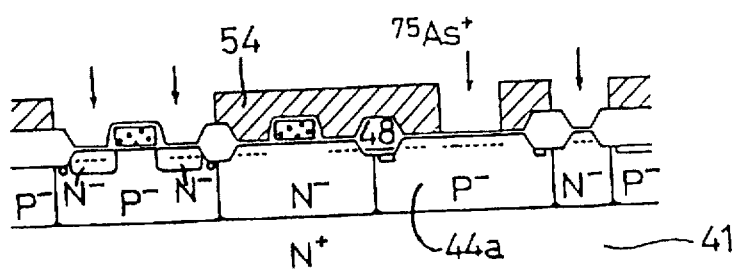

As shown in FIG. 27, a mask 54 is formed and $^{75}As^+$ ions are implanted in the same manner as Example 1 into regions to be an emitter and collector contact diffusion region of the ESD, source/drain region of the NMOS having LDD structure, and a well contact diffusion region of the PMOS (not shown in FIG. 27).

Figure 28:
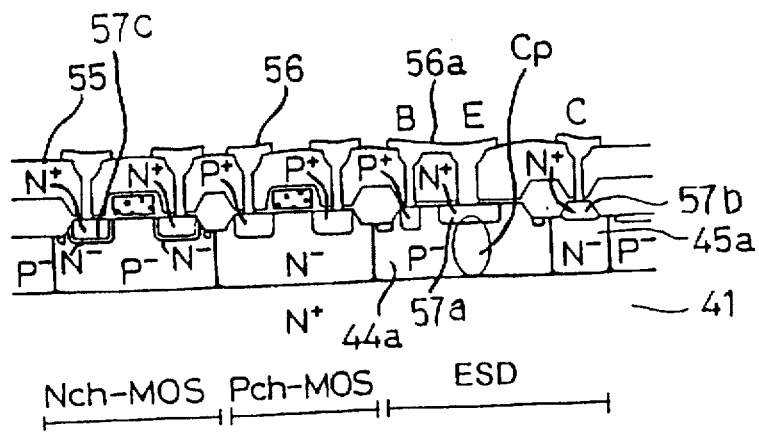

Further, as shown in FIG. 28, after forming the base contact diffusion region of the ESD, source/drain of the PMOS, the emitter 57a and collector contact diffusion region 57b of the ESD and source/drain region 57c of the NMOS, an NSG/BPSG film 55 and a metal wiring 56 are formed on the whole surface of the semiconductor substrate 41 in the same manner as Example 1. Then, the emitter 57a and base 44a of the ESD are shorted with a metal 56a.

FIG. 29 shows a plan view of thus formed ESD in the semiconductor device and FIG. 30 shows a concentration profile beneath the emitter of the ESD.

When a reverse bias is applied to the collector of the bipolar transistor of this type which works as the ESD, punch-through occurs in a region shown as Cp in FIG. 28, whereby an electric current starts flowing. If the reverse bias is further applied, transistor functions and snap-back occur at about 14V. As a result, the collector voltage decreases, so that the electric current increases further as shown in FIG. 11.

FIG. 12 also shows an equivalent circuit of Example 3 showing a part of the semiconductor device comprising bipolar transistor which works as ESD. However, since the whole surface of the $N^+$ substrate is used as the collector in the present example, the $N^+$ substrate becomes $V_{DD}$ and works as a protection device only for the $V_{DD}$ side (upper side) in FIG. 12. Therefore, another protection device is required for GND side. In that case, it is not necessary to have an $N^-$ well (collector), $N^+$ collector contact diffusion region and metal wiring (collector) of the ESD of Example 3. If the polarity of the ESD is opposite to the present example, the $P^+$ substrate is used and grounded, and it works as a protection device only for the GND side.

EXAMPLE 4

Example 4 relates to a bipolar type semiconductor device comprising a bipolar transistor as an ESD which causes snap-back triggered by punch-through.

Figure 31:
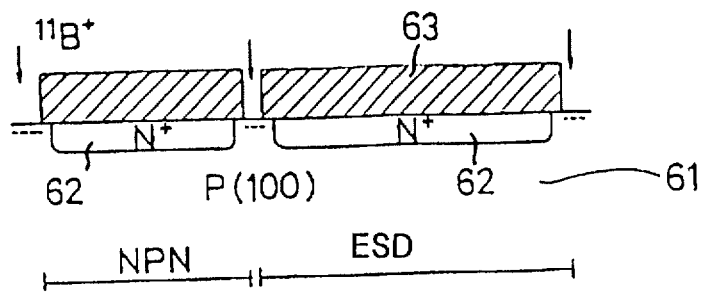
FIGS. 31 to 34 are a sectional view of a semiconductor device in each step of a first half of manufacturing process of Example 4.

As shown in FIG. 31, a P type silicon substrate 61 is used. Firstly, $N^+$ diffusion regions 62 are formed in the respective $N^+$ buried collector formation regions of NPN transistors, one of which works as an ESD and the other as a general NPN transistors, in the same manner as Example 1. Then, $^{11}B^+$ ions are implanted in a device isolation region.

Figure 32:
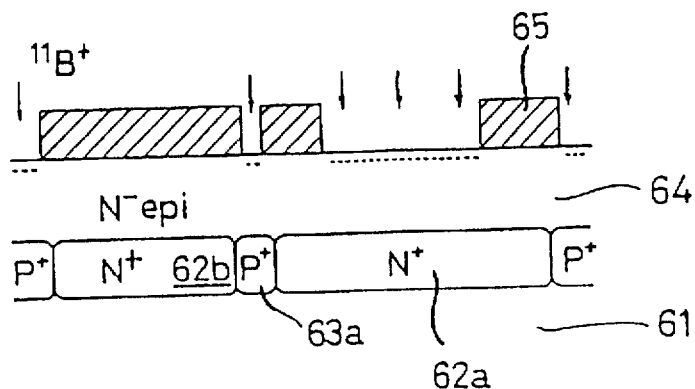

As shown in FIG. 32, an $N^-$ epitaxial layer 64 is grown with a thickness of about 3.1 microns and a buried collector 62a of the ESD, buried collector 62b of the NPN transistor for general use and $P^+$ buried layer 63a are formed. Then, a mask 65 is formed and $^{11}B^+$ ions are implanted in the same manner as Example 1 for obtaining a $P^-$ well having a relatively high resistivity which comprises a base and a device isolation region.

Figure 33:
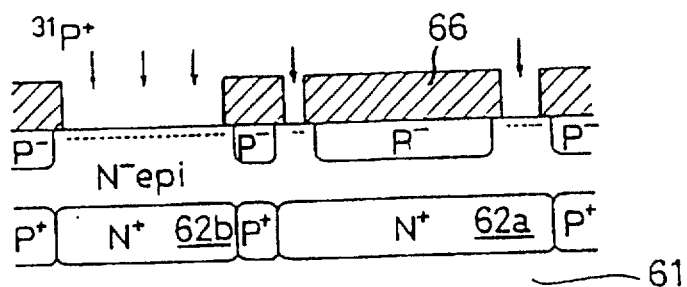

As shown in FIG. 33, a mask 66 is formed and $^{31}P^+$ ions are implanted in the same manner as Example 1 for forming a collector diffusion region of the ESD and NPN transistor.

Figure 34:
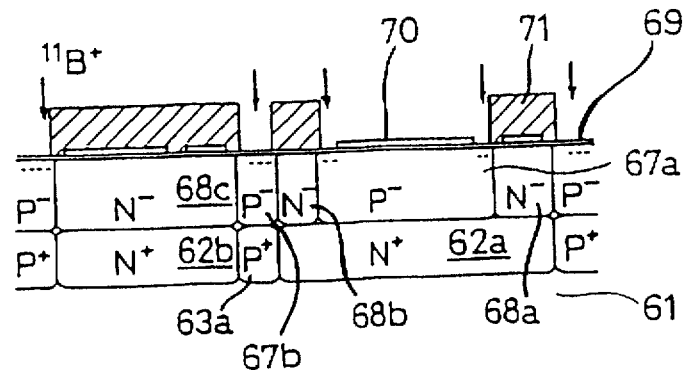

In the same manner as Example 1, the resulting substrate is subjected to thermal treatment and $^{11}B^+$ and $^{31}P^+$ are driven in a desired region, respectively, whereby a $P^-$ well comprising a base 67a of the ESD and a lightly doped well 67b for device isolation, and an $N^-$ well comprising collector diffusion region 68a, 68b of the ESD and a collector diffusion region 68c of the NPN transistor are formed as shown in FIG. 34. In that case, the concentration of the $P^-$ well comprising the base 67a and the lightly doped well 67b for device isolation is about $2 \times 10^{16}$ cm$^{-3}$ and a diffusion depth thereof is about 1.5 microns. Further, in the same manner as Example 1, an SiO$_2$ film 69 and nitride film 70 are formed and the nitride film 70 is etched to have a desired shape. In order to prevent the reverse of the $P^-$ well surface, a mask 71 is formed and $^{11}B^+$ ions are implanted in the same manner as Example 1.

Figure 35:
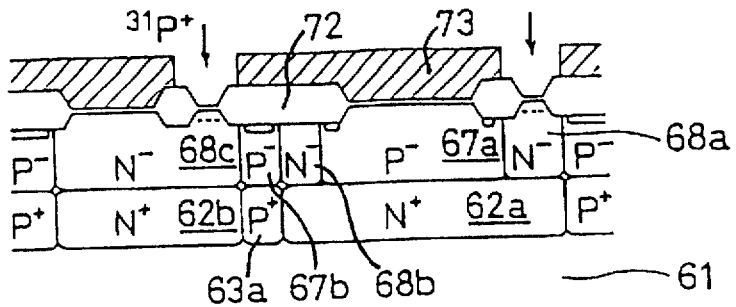
FIGS. 35 to 38 are a sectional view of a semiconductor device in each step of a second half of manufacturing process of Example 4.

Next, as shown in FIG. 35, after forming a field oxide film 72 as a device isolation, a mask 73 is formed with a desire shape by photolithographic process in the same manner as Example 1. Then, $^{31}P^+$ ions are implanted into regions to be $N^+$ plug diffusion regions (about $3 \times 10^{19}$ cm$^{-3}$) in the collector diffusion region 68a for the ESD and the collector diffusion region 68c for the NPN transistor (100 KeV, $1 \times 10^{15}$ cm$^{-2}$).

Figure 36:
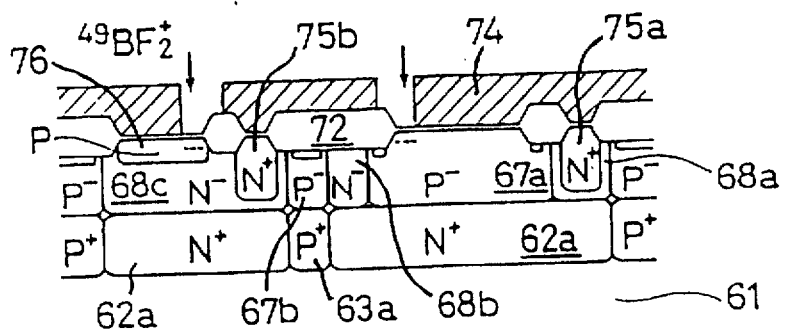

Next, as shown in FIG. 36 after forming a $N^+$ plug diffusion region 75a of the ESD and $N^+$ plug diffusion region 75b of the NPN transistor, a base 76 of NPN transistor is formed. Then, a mask 74 is formed by photolithographic process with a desired shape and $^{49}BF_2^+$ ions are implanted (50 KeV, $5 \times 10^{15}$ cm$^{-2}$) into regions to be base contact diffusion regions for the ESD and NPN transistor.

Figure 37:
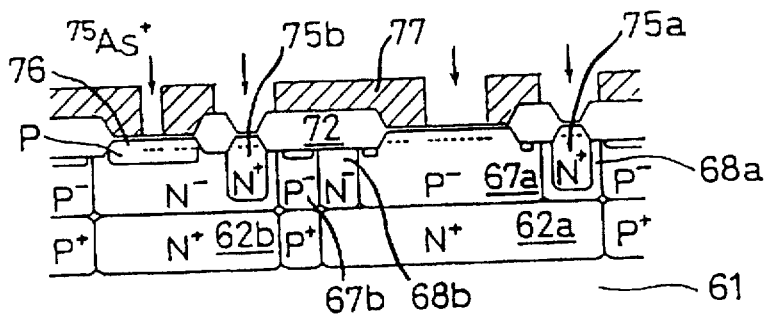

Further, as shown in FIG. 37, a mask 77 is formed with a desired shape by photolithographic process and $^{75}As^+$ ions are implanted (80 KeV, $5 \times 10^{15}$ cm$^{-2}$) into regions to be emitters and collector contact diffusion regions ($2 \times 10^{20}$ cm$^{-3}$) both of the ESD and NPN transistor.

Figure 38:
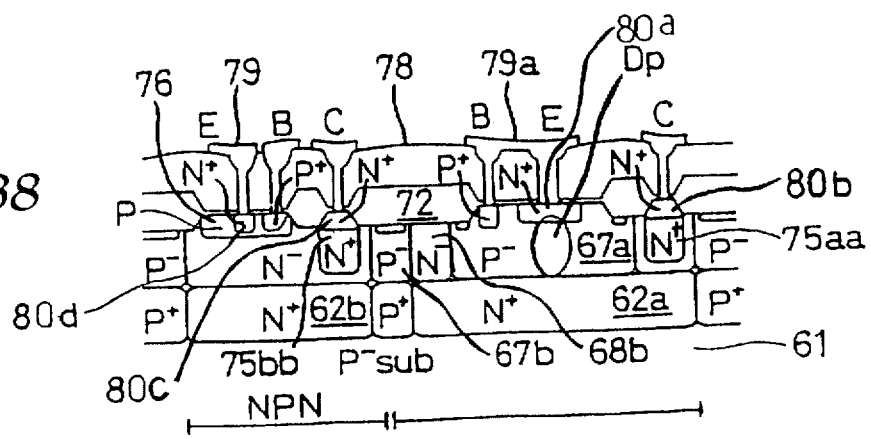

Subsequently, as shown in FIG. 38 after forming the base contact diffusion region and the emitter 80a of the ESD, an emitter 80d of the NPN transistor, a collector contact diffusion region 80b and a collector sinker region 75aa (which is the portion of the $N^+$ plug diffusion region 75a other than the collector contact diffusion region 80b) of the ESD and a collector contact diffusion region 80c and a collector sinker region 75bb (which is the portion of the $N^+$ plug diffusion region 75b other than the collector contact diffusion region 80c) of the NPN transistor, an NSG/BPSG film 78 is formed on the surface of a semiconductor substrate 61 in the same manner as Example 1 and a metal wiring 79 is formed. In that case, the emitter 80a and base 67a of the ESD are shorted with a metal 79a.

FIG. 39 shows a plan view of thus formed ESD in the semiconductor device and FIG. 40 shows a concentration profile beneath the emitter of the ESD.

When a reverse bias is applied to the collector of the bipolar transistor of this type which works as the ESD, punch-through occurs in a region shown as region Dp in FIG. 38, whereby an electric current starts flowing. If the reverse bias is further applied, transistor function and snap-back occur at about 14V. As a result, the collector voltage decreases, so that the electric current increases further as shown in FIG. 11.

FIG. 12 also shows an equivalent circuit of Example 4 showing a part of the semiconductor device comprising bipolar transistor working as the ESD.

EXAMPLE 5

Example 5 relates to BiCMOS type semiconductor device comprising a bipolar transistor as an ESD which causes snap-back triggered by punch-through.

Figure 41:
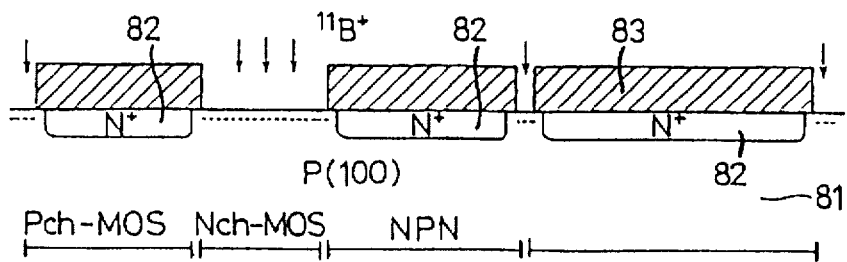
FIGS. 41 to 44 are a sectional view of a semiconductor device in each step of a first half of manufacturing process of Example 5.

An $N^+$ diffusion region 82 is formed in regions where $N^+$ buried collector of the ESD and an NPN transistor for general use, and buried layer for a PMOS are formed on a P type silicon substrate 81, respectively as shown in FIG. 41 in the same manner of Example 1. Subsequently, $^{11}B^+$ ions are implanted (50 KeV, 1×10$^{14}$ cm$^{-2}$) into regions where P$^+$ buried layer for an NMOS and a device isolation region are formed by using a resist 83 as a mask.

Figure 42:
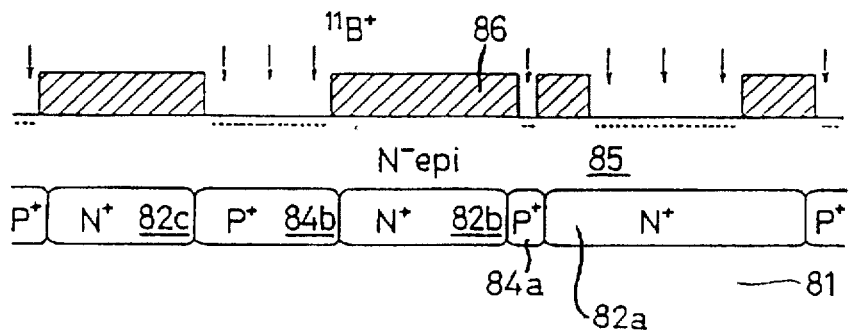

Next, as shown in FIG. 42, an N$^-$ epitaxial layer 85 is grown with a thickness of about 3.1 micron, a buried collector 82a of the ESD and a buried collector 82b of the NPN transistor are formed. Next, a mask 86 is formed and $^{11}$B$^+$ ions are implanted for forming a P$^-$ well having a relatively high resistivity which comprise a base of the ESD, the NMOS formation region and a device isolation region in the same manner as Example 1.

Figure 43:
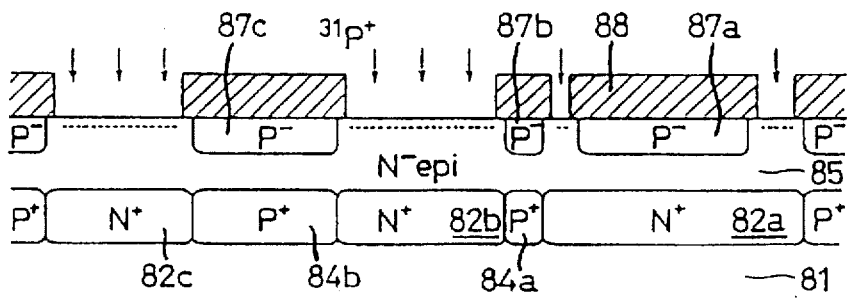

Subsequently, as shown in FIG. 43, a mask 88 is formed and $^{31}$p$^+$ ions are implanted to obtain an N$^-$ well of a PMOS formation region and a collector diffusion region for the ESD and NPN transistor in the same manner as Example 1.

Figure 44:
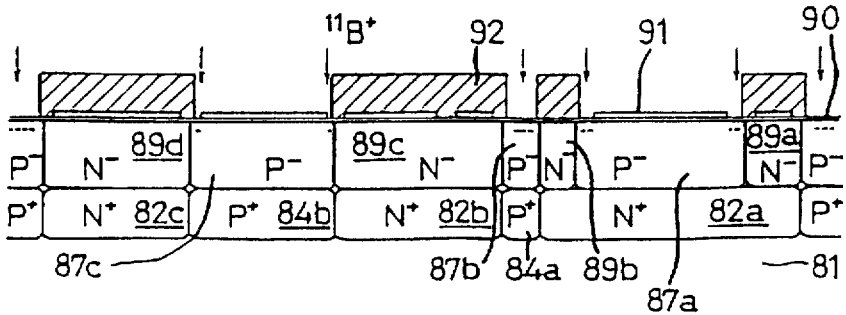

As shown in FIG. 44, the substrate is subjected to thermal treatment in the same manner of Example 1 and $^{11}$B$^+$ and $^{31}$P$^+$ ions are driven in the desired region, respectively, whereby a P$^-$ well comprising a base 87a, lightly doped well 87b for device isolation, lightly doped well 87c for an NMOS formation region and N$^-$ well comprising collector diffusion region 89a, 89b of the ESD, a collector diffusion region 89c for the NPN transistor; and the PMOS formation region 89d are formed. In that case, the concentration of the base 87a, lightly doped well for device isolation 87b and the NMOS formation region 87c which work as a P$^-$ well is about 2×10$^{16}$ cm$^{-3}$ and a diffusion depth thereof is about 1.5 microns. Further, an SiO$_2$ film 90 and a nitride film 91 are formed and etched in the same manner as Example 1. Then, in order to prevent the reverse of the P$^-$ well surface, a mask 92 is formed and $^{11}$B$^+$ ions are implanted in the same manner as Example 1.

Figure 45:
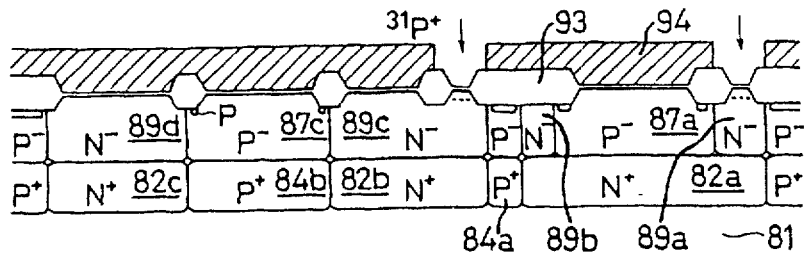
FIGS. 45 to 48 are a sectional view of a semiconductor device in each step of a second half of manufacturing process of Example 5.

Next, as shown in FIG. 45, after forming a field oxide film 93 as a device isolation, a mask 94 is formed with a desired shape by photolithographic process and $^{31}$P$^+$ ions are implanted (100 KeV, 1×10$^{15}$ cm$^{-2}$) into regions to be N$^+$ plug diffusion regions (3×10$^{19}$ cm$^{-3}$) in the collector diffusion region 89a of the ESD and the collector diffusion region 89c of the NPN transistor.

Figure 46:
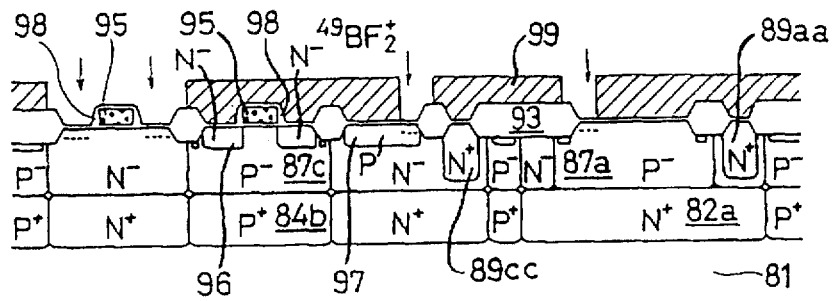

As shown in FIG. 46, after forming a N$^+$ plug diffusion region 89aa of the ESD and a N$^+$ plug diffusion region 89cc of the NPN transistor, a gate electrode 95 of the NMOS and PMOS are formed. Further, N$^-$ diffusion regions 96 for the NMOS and a base 97 of NPN transistor are formed, and then, a side wall spacers 98 are formed on the gate electrodes 95. Subsequently, a mask 99 is formed with a desired shape by photolithographic process and $^{49}$BF$_2^+$ ions are implanted (50 KeV, 5×10$^{15}$ cm$^{-2}$) into regions to be base contact diffusion regions both of the ESD and NPN transistor, source/drain regions of the PMOS, and a well contact diffusion region of the NMOS (not shown in FIG. 46).

Figure 47:
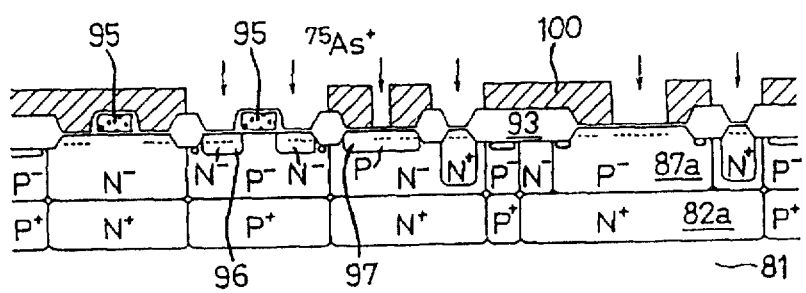

Next, as shown in FIG. 47, a mask 100 is formed with a desired shape by photolithographic process and $^{75}$As$^+$ ions are implanted (about 2×10$^{20}$ cm$^{-3}$, 80 KeV, 5×10$^{15}$ cm$^{-2}$) into emitters and collector contact diffusion regions both of the ESD and NPN transistor, source/drain regions of the NMOS, a well contact diffusion region of the PMOS (not shown in FIG. 47).

Figure 48:
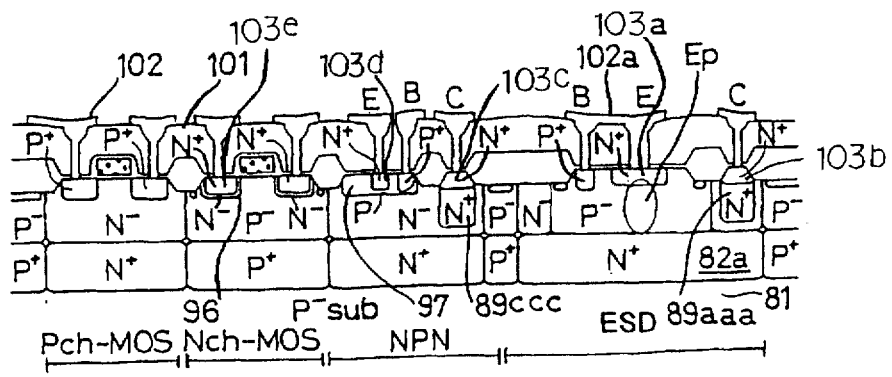

Further, as shown in FIG. 48, after forming the base contact diffusion regions both of the ESD and NPN transistor, and the emitter 103a, 103d both of the ESD and NPN transistor, source/drain and the well contact diffusion region (not shown in FIG. 48) of the PMOS, source/drain 103e and the well contact diffusion region (not shown in FIG. 48) of the NMOS, collector contact diffusion region 103b and a collector sinker region 89aaa (which is the portion of the N$^+$ plug diffusion region 89aa other than the collector contact diffusion region 103b) of the ESD and the collector contact diffusion region 103c and a collector sinker region 89ccc (which is the portion of the N$^+$ plug diffusion region 89cc other than the collector contact diffusion region 103c) of NPN transistor, an NSG/BPSG film 101 and metal wiring 102 are formed on the surface of the semiconductor substrate 81 in the same manner as Example 1. Then, the emitter 103a and base 87a of the ESD are shorted with a metal 102a.

FIG. 39 shows a plan view of thus formed ESD in the semiconductor device and FIG. 40 shows a concentration profile beneath the emitter of the ESD.

When a reverse bias is applied to the collector of the bipolar transistor of this type which works as the ESD, punch-through occurs in a region shown as region Ep in FIG. 48, whereby an electric current starts flowing. If the reverse bias is further applied, transistor function and snap-back occur at about 14V. As a result, the collector voltage decreases, so that the electric current increases further as shown in FIG. 11.

FIG. 12 also shows an equivalent circuit of Example 5 showing a part of the semiconductor device comprising bipolar transistor of the ESD.

EXAMPLE 6

Example 6 relates to MOS type semiconductor device comprising a vertical type bipolar transistor as an ESD which causes snap-back triggered by an avalanche breakdown that can compensate high punch-through breakdown voltage caused by a variety of thickness of the epitaxial layer in the manufacturing process.

Figure 49:
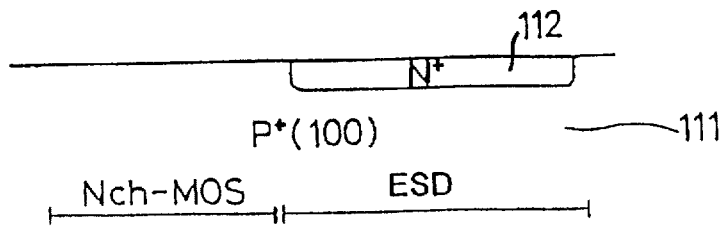
FIGS. 49 to 52 are a sectional view of a semiconductor device in each step of a first half of manufacturing process of Example 6.

An N$^+$ diffusion region 112 is formed in an N$^+$ buried collector formation region of the ESD on a p type silicon substrate 111 in the same manner as Example 1 as shown in FIG. 49.

Figure 50:
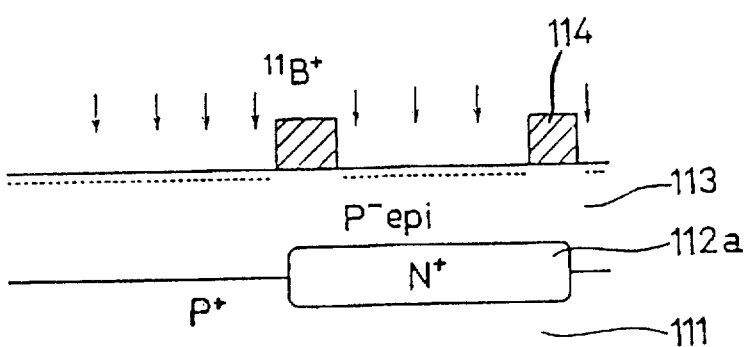

As shown in FIG. 50, a P$^-$ epitaxial layer 113 is grown with a thickness of about 3.1 micron, an N$^+$ buried collector 112a of the ESD are formed in the same manner as Example 1. Next, $^{11}$B$^+$ ions are implanted by using a mask 114 for forming a P$^-$ well having a relatively high resistivity comprising a base of the ESD and an NMOS formation region in the same manner as Example 1.

Figure 51:
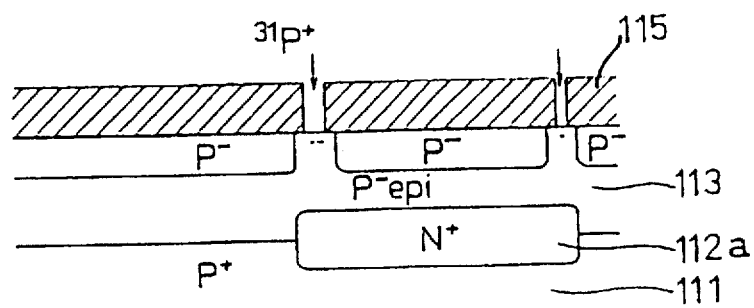

Subsequently, as shown in FIG. 51, $^{31}$p$^+$ ions are implanted to obtain an N$^-$ well which works as a collector diffusion region of the ESD by using a mask 115 in the manner as Example 1.

Figure 52:
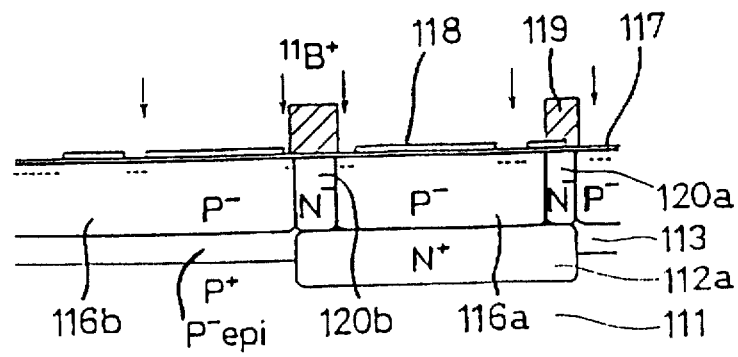

As shown in FIG. 52, the substrate is subjected to thermal treatment in the same manner of Example 1 and a P$^-$ well comprising a base 116a, lightly doped well 116b for N MOS formation region and N$^-$ well comprising collector diffusion region 120a, 120b are formed. In that case, the concentration of the P$^-$ well which comprises the base 116a and lightly doped well 116b for the NMOS formation region is about 2×10$^{16}$ cm$^{-3}$ and a diffusion depth thereof is about 1.5 microns. Further, an SiO$_2$ film 117 and a nitride film 118 are formed and etched to have a desired shape in the same manner as Example 1. Then, a mask 119 is formed with a desired shape by photolithographic process and $^{11}$B$^+$ ions are implanted (30 KeV, 5×10$^{13}$ cm$^{-2}$) into region to be P$^+$ highly doped diffusion regions in the same manner as Example 1.

Figure 53:
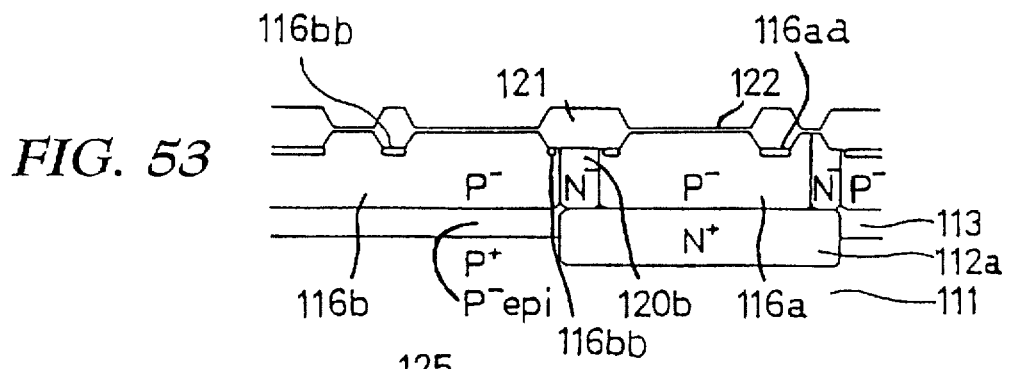
FIGS. 53 to 56 are a sectional view of a semiconductor device in each step of a second half of manufacturing process of Example 6.

Next, as shown in FIG. 53, after forming the highly doped diffusion region 116aa for controlling avalanche breakdown voltage between the N$^+$ collector contact diffusion region to be formed in the following step and the P⁺ highly doped diffusion region 116aa in P⁻ base 116a of the ESD and a highly doped diffusion region 116bb for preventing the reverse of the surface of the P⁻ well, a field oxide film 121 as a device isolation and a gate oxide film 122 are formed. In that case, the concentration of the highly doped diffusion regions 116aa and 116bb is about $1 \times 10^{17}$ cm⁻³. The highly doped diffusion region 116aa is formed so as to locate under the field oxide film 121 and contact with the collector contact diffusion region to be formed in the following step.

Figure 54:
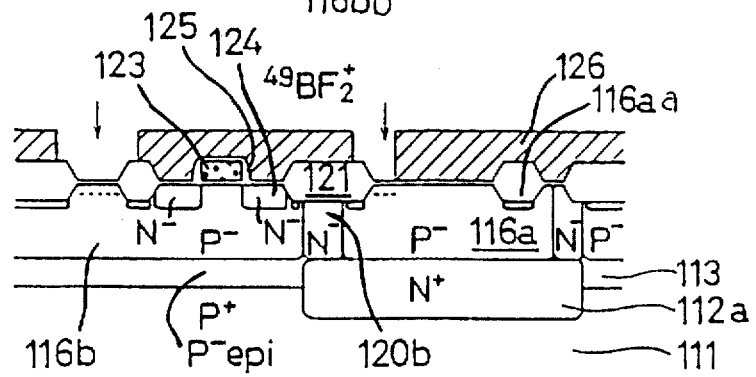

As shown in FIG. 54, a gate electrode 123 of the MOS transistor, an N⁻ diffusion region 124 of the NMOS and a side wall spacer 125 are formed. Subsequently, $^{49}BF_2^+$ ions are implanted by using a mask 126 into regions to be a base contact diffusion region of the ESD and a well contact diffusion region of the NMOS.

Figure 55:
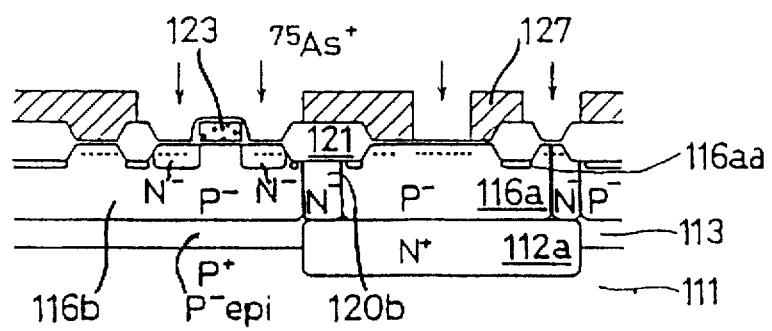

Next, as shown in FIG. 55, $^{75}As^+$ ions are implanted (about $2 \times 10^{20}$ cm⁻³) by using a mask 127 in the same manner as Example 1 into regions to be an emitter and the collector contact diffusion region of the ESD and source/drain regions of NMOS.

Figure 56:
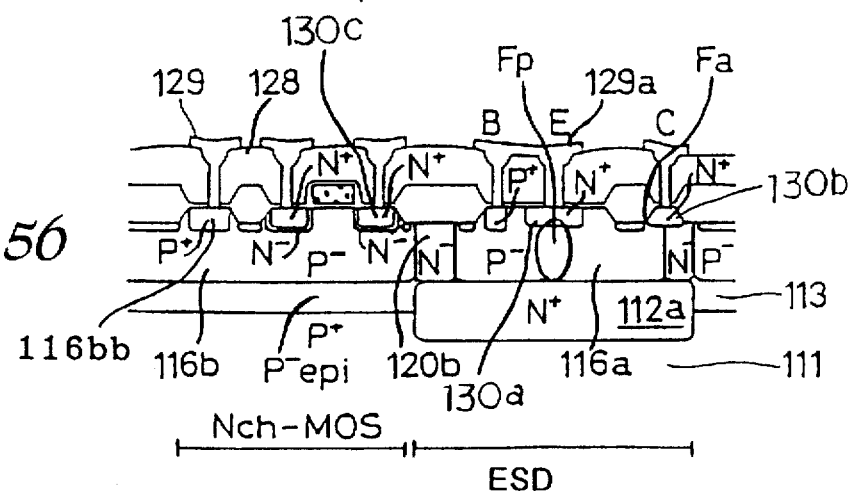

Further, as shown in FIG. 56, after forming the base contact diffusion region of the ESD, the well contact diffusion region 116bb of the NMOS, and the emitter 130a of the ESD, the collector contact diffusion region 130b contacted with the highly doped diffusion region 116aa and source/drain regions 130c of the NMOS having LDD structure, an NSG/BPSG film 128 and metal wiring 129 are formed on the surface of the semiconductor substrate 111. Then, the emitter 130a and base 116a of the ESD are shorted with a metal 129a.

Figure 57:
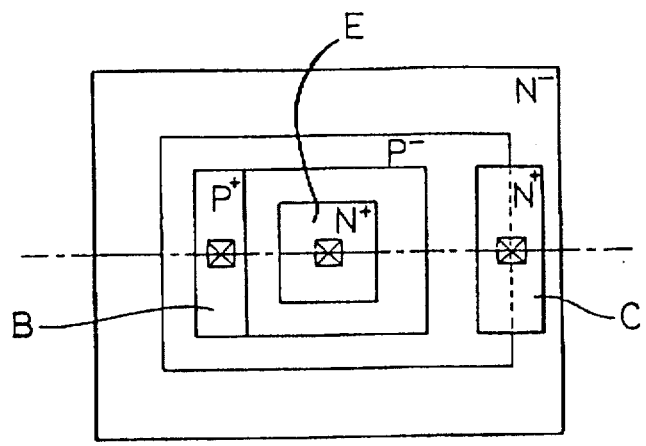
FIG. 57 is a plan view showing an arrangement of a diffusion region of an electrostatic discharge protection device of Examples 6 and 7.

FIG. 57 shows a plan view of thus formed ESD in the semiconductor device and FIG. 10 shows a concentration profile beneath the emitter of the ESD.

When a reverse bias is applied to the collector of the bipolar transistor of this type used for the ESD in which the epitaxial layer has a desired thickness or less, punch-through occurs in a region shown as region Fp in FIG. 56, whereby an electric current starts flowing. If the reverse bias is further applied, transistor function and snap-back occur, whereby the electric current increases further.

Figure 58:
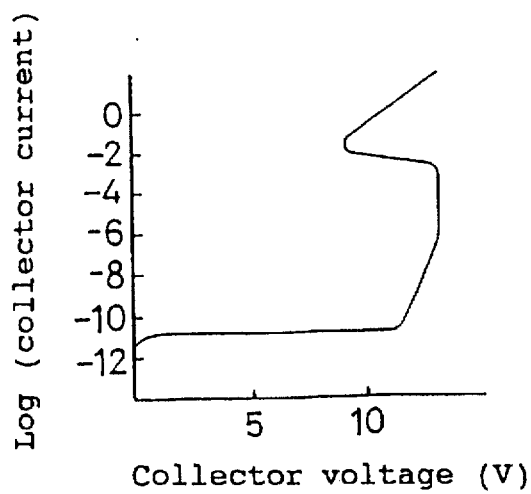
FIG. 58 is a graph showing a concentration profile beneath an emitter of an electrostatic discharge protection device of Examples 6 to 10.

If the thickness of the epitaxial layer is bounded to a thickness thicker than the desired thickness, the punch-through breakdown voltage is shifted to a higher voltage. Accordingly, the avalanche breakdown occurs at about 14V between the collector contact diffusion region and highly doped diffusion region (shown as Fa in FIG. 56) before snap-back occurs triggered by punch-through (shown as region Fp in FIG. 56). The emitter junction is biased transitionally to the forward direction because of the decrease of voltage in the base having a high resistivity. As a result, transistor functions and snap-back occurs triggered by the avalanche breakdown as shown in FIG. 58, whereby a great electric current flows.

FIG. 12 also shows an equivalent circuit of Example 6 showing a part of the semiconductor device comprising bipolar transistor of the ESD.

The ESD of the present example does not comprise a collector sinker region, but it may be formed in an additional step. In this case, the collector sinker region may be contacted with the P⁺ highly doped diffusion region. Further, in the present example, P⁺ highly doped diffusion region does not necessarily contact with the collector contact diffusion region, provided that the collector sinker region contacts with the P⁺ highly doped diffusion region. In addition, the collector contact diffusion region (and/or the collector sinker region) may be formed inside of the collector diffusion region, provided that the highly doped diffusion region, contacts with the collector sinker region and/or the collector contact diffusion region. Moreover, both of the N⁺ buried diffusion region and epitaxial layer are formed in the present example, but N⁺ buried diffusion region may be also formed without providing an epitaxial layer by implanting high energy.

EXAMPLE 7

Example 7 relates to CMOS type semiconductor device comprising a vertical type bipolar transistor as an ESD which causes snap-back triggered by an avalanche breakdown that can compensate high punch-through breakdown voltage caused by a variety of thickness of the epitaxial layer in the manufacturing process.

Figure 59:
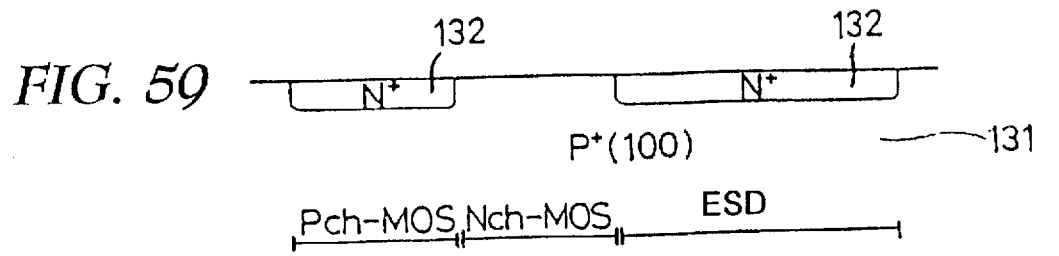
FIGS. 59 to 62 are a sectional view of a semiconductor device in each step of a first half of manufacturing process of Example 7.

An N⁺ diffusion region 132 is formed in an N⁺ buried collector formation region of the ESD and buried layer for PMOS on a P type silicon substrate 131 in the same manner as Example 1 as shown in FIG. 59.

Figure 60:
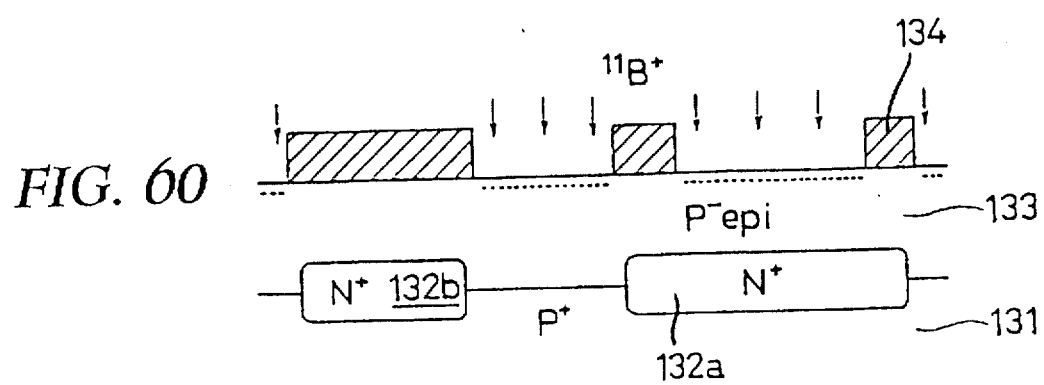

As shown in FIG. 60, an P⁻ epitaxial layer 133 is grown with a thickness of about 3.1 micron, an N⁺ buried collector 132a of the ESD is formed in the same manner as Example 1. Next, $^{11}B^+$ ions are implanted by using a mask 134 for forming a P⁻ well having a relatively high resistivity which is used for a base of the ESD and NMOS formation region in the same manner as Example 1.

Figure 61:
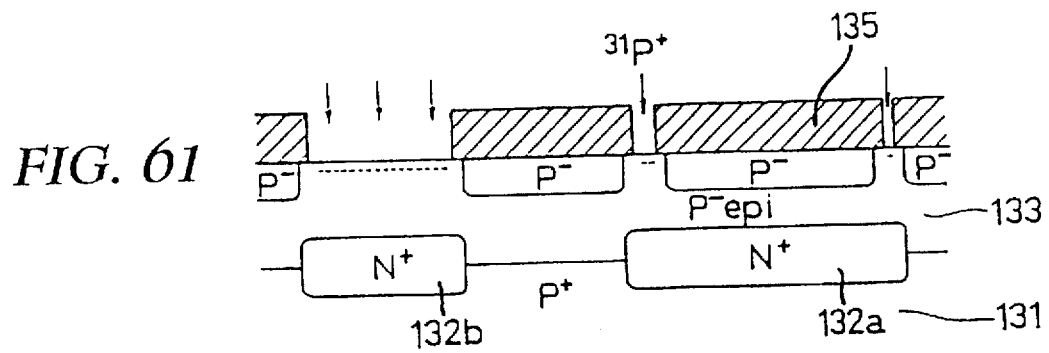

Subsequently, as shown in FIG. 61, $^{31}P^+$ ions are implanted to obtain an N⁻ well which works as a collector diffusion region of the ESD and a PMOS formation region by using a mask 135 in the manner as Example 1.

Figure 62:
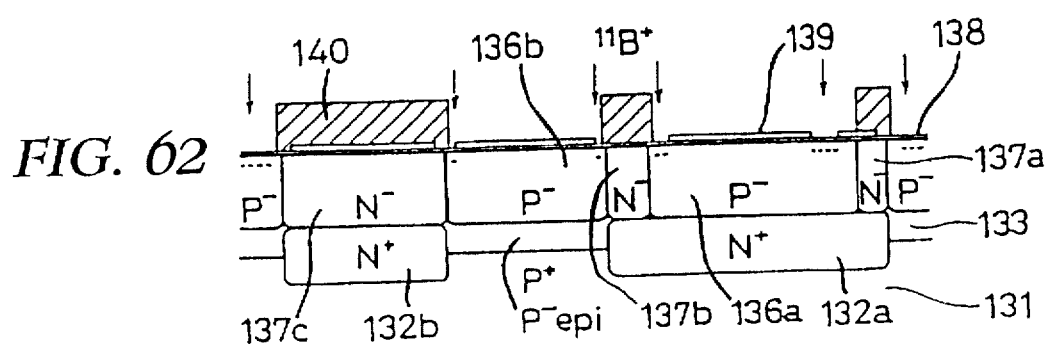

As shown in FIG. 62, a P⁻ well comprising a base 136a, lightly doped well 136b for an NMOS formation region and N⁻ well comprising collector diffusion region 137a, 137b and lightly doped well 137c for PMOS formation region are formed. In that case, the concentration of the P⁻ wells comprises the base 136a and lightly doped well 136b for the NMOS formation region is about $2 \times 10^{16}$ cm⁻³ and a diffusion depth thereof is about 1.5 microns. Further, an SiO₂ film 138 and a nitride film 139 are formed and etched to have a desired shape in the same manner as Example 1. Then, $^{11}B^+$ ions are implanted by using a mask 140 into region to be P⁺ highly doped regions in the same manner as Example 1.

Figure 63:
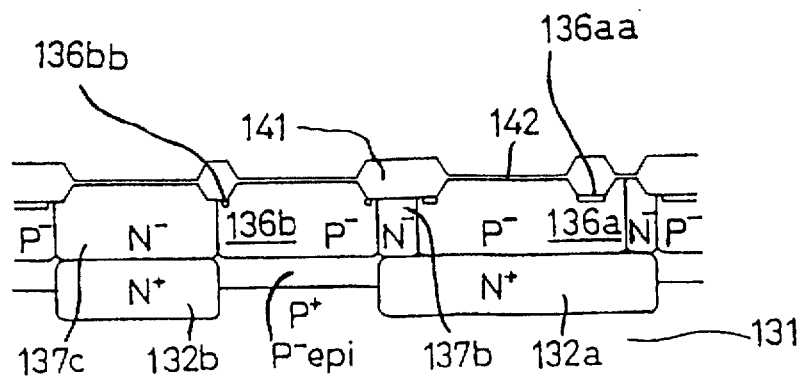
FIGS. 63 to 66 are a sectional view of a semiconductor device in each step of a second half of manufacturing process of Example 7.

Next, as shown in FIG. 63, after forming the highly doped diffusion region 136aa for controlling avalanche breakdown voltage between the N⁺ collector contact diffusion region to be formed in the following step and the P⁺ highly doped diffusion region 136aa in P⁻ base 136a of the ESD and a highly doped diffusion region 136bb for preventing the reverse of the surface of the P⁻ well 136b, a field oxide film 141 as a device isolation and a gate oxide film 142 are formed. In that case, the concentration of the highly doped diffusion region 136aa and 136bb is about $1 \times 10^{17}$ cm⁻³. The highly doped diffusion region 136aa is formed so as to locate under the field oxide film 141 and contact with the collector contact diffusion region to be formed in the following step.

Figure 64:
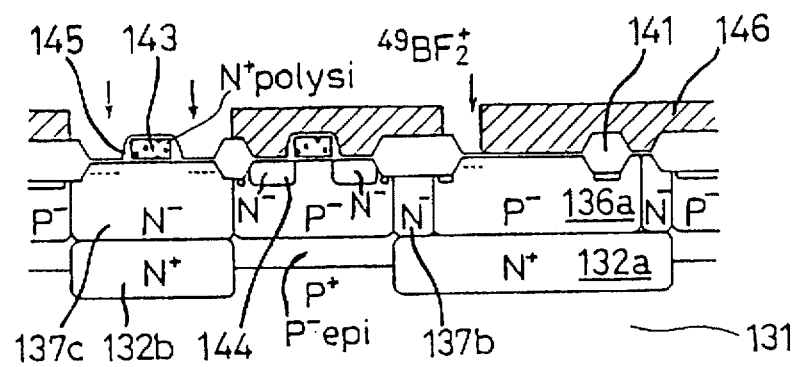

As shown in FIG. 64, a gate electrode 143 of the NMOS and PMOS, an N⁻ diffusion regions 144 for the NMOS and a side wall spacer 145 are formed in the same manner as Example 1. Subsequently, $^{49}BF_2^+$ ions are implanted by using a mask 146 into regions to be a base contact diffusion region of the ESD, source/drain regions of the PMOS and a well contact diffusion region of the NMOS (not shown in FIG. 64).

Figure 65:
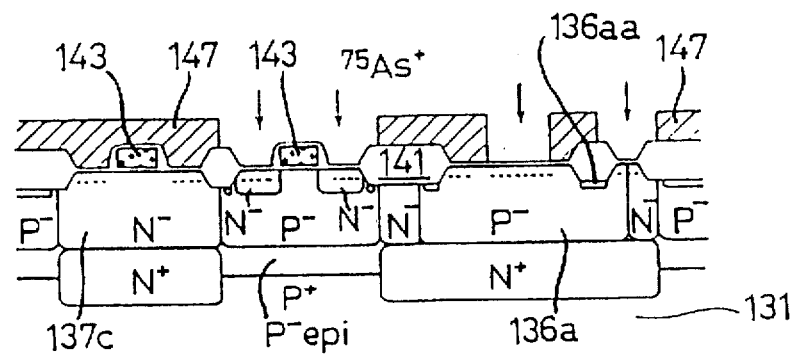

Next, as shown in FIG. 65, $^{75}As^+$ ions are implanted by using a mask 147 in the same manner as Example 1 into region to be an emitter and a collector contact diffusion region of the ESD, a source/drain region of the NMOS and a well contact diffusion region of the PMOS (not shown in FIG. 65).

Figure 66:
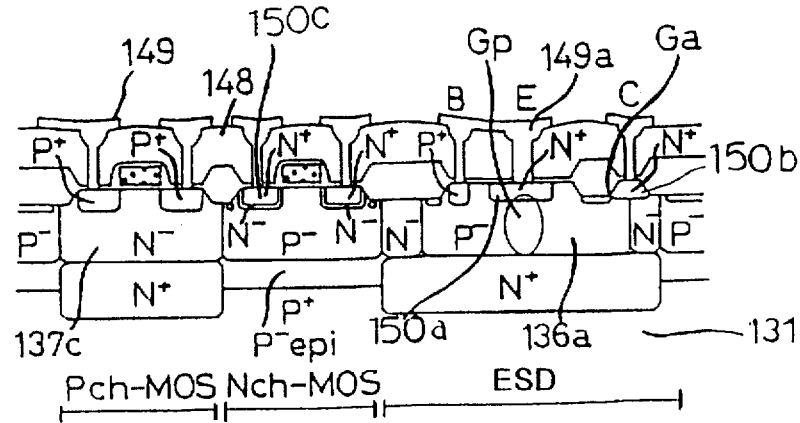

Further, as shown in FIG. 66, after forming the base contact diffusion region of the ESD, source/drain region and the well contact diffusion region (not shown in FIG. 66) of the PMOS, and the emitter 150a, collector contact diffusion region 150b contacted with the highly doped diffusion region 136aa of the ESD and source/drain region 150c and the well contact diffusion region (not shown in FIG. 66) of the NMOS having LDD structure, an NSG/BPSG film 148 and metal wiring 149 are formed on the surface of the semiconductor substrate 131 in the same manner as Example 1. Then, the emitter 150a and base 136a of the ESD are shorted with a metal 149a.

FIG. 57 shows a plan view of thus formed ESD in the semiconductor device and FIG. 10 shows a concentration profile beneath the emitter of the ESD.

When a reverse bias is applied to the collector of the bipolar transistor of this type used for the ESD in which the epitaxial layer has a desired thickness or less, punch-through occurs in a region shown as region Gp in FIG. 66, whereby an electric current starts flowing. If the reverse bias is further applied, transistor function and snap-back occur at about 14V, and collector voltage reduces, whereby the electric current increases further as shown in FIG. 11.

If the thickness of the epitaxial layer is formed to a thickness thicker than the desired thickness, the punch-through breakdown voltage is shifted to a higher voltage. Accordingly, the avalanche breakdown occurs at about 14V between the collector contact diffusion region and the $P^+$ highly doped diffusion region (shown as region Ga in FIG. 66) before snap-back occurs triggered by punch-through (shown as region Gp in FIG. 66). The emitter junction is biased transitionally to the forward direction because of the decrease of voltage in the base having a high resistivity. As a result, transistor functions and snap-back occurs triggered by the avalanche breakdown as shown in FIG. 58, whereby a great electric current flows.

FIG. 12 also shows an equivalent circuit of Example 7 showing a part of the semiconductor device comprising bipolar transistor of the ESD.

The ESD of the present example does not comprise a collector sinker region, but it may be formed in an additional step. In this case, the collector sinker region may be contacted with the $P^+$ highly doped diffusion region. Further, in the present example, $P^+$ highly doped diffusion region does not necessarily contact with the collector contact diffusion region, provided that the collector sinker region contacts with the $P^+$ highly doped diffusion region. In addition, the collector contact diffusion region (and/or the collector sinker region) may be formed inside of the collector diffusion region, provided that the highly doped diffusion region contacts with the collector sinker region and/or the collector contact diffusion region. Moreover, both of the $N^+$ buried collector and epitaxial layer are formed in the present example, but $N^+$ buried collector may be also formed without providing an epitaxial layer by implanting high energy.

EXAMPLE 8

Example 8 relates to CMOS type semiconductor device comprising a vertical type bipolar transistor as an ESD which causes snap-back triggered by an avalanche breakdown that can compensate high punch-through breakdown voltage caused by a variety of thickness of the epitaxial layer in the manufacturing process.

Figure 67:
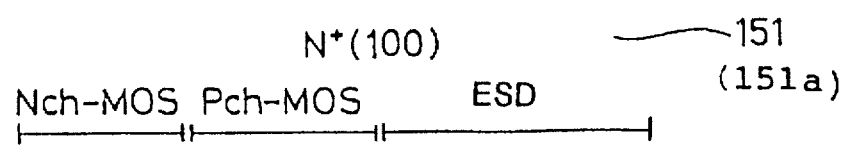
FIGS. 67 to 70 are a sectional view of a semiconductor device in each step of a first half of manufacturing process of Example 8.

As shown in FIG. 67, $N^+$ type silicon substrate 151 is used.

Figure 68:
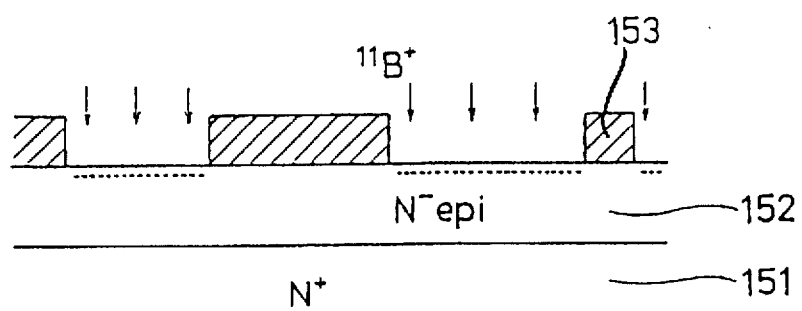

As shown in FIG. 68, an $N^-$ epitaxial layer 152 is grown with a thickness of about 3.1 micron on the substrate 151 in the same manner as Example 1. Next, $^{11}B^+$ ions are implanted by using a mask 153 for forming a $P^-$ well having a relatively high resistivity which is used for a base of the ESD and an NMOS formation region.

Figure 69:
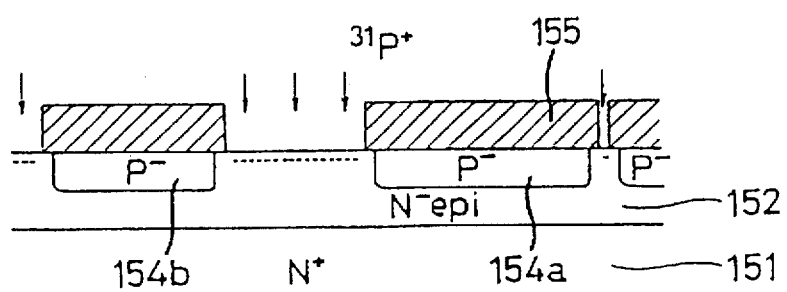

Subsequently, as shown in FIG. 69, $^{31}P^+$ ions are implanted to obtain an $N^-$ well which is used for a collector diffusion region of the ESD and a PMOS formation region by using a mask 155.

Figure 70:
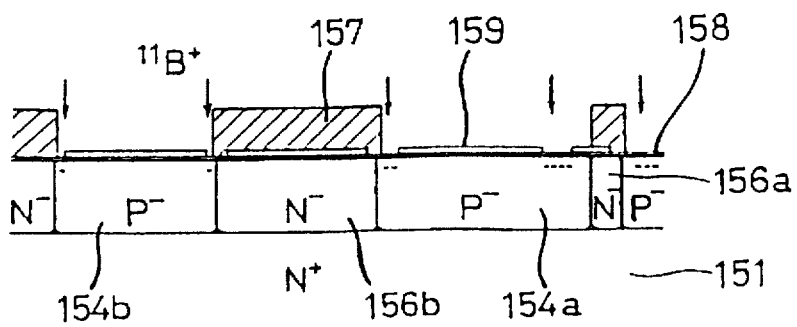

As shown in FIG. 70, a $P^-$ well comprising a base 154a, lightly doped well 154b for the NMOS formation region and $N^-$ well comprising a collector diffusion region 156a and lightly doped well 156b for the PMOS formation region are formed. In that case, the concentration of the $P^-$ wells which comprises the base 154a and lightly doped well 154b for the NMOS formation region is about $2\times10^{16}$ cm$^{-3}$ and a diffusion depth thereof is about 1.5 microns. Further, an $SiO_2$ film 158 and a nitride film 159 are formed in the same manner as Example 1 and etched to have a desired shape. Then, $^{11}B^+$ ions are implanted into regions to be $P^+$ highly doped diffusion regions in the same manner as Example 1.

Figure 71:
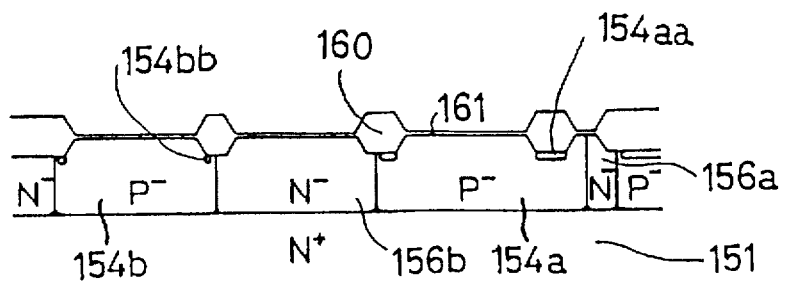
FIGS. 71 to 74 are a sectional view of a semiconductor device in each step of a second half of manufacturing process of Example 8.

Next, as shown in FIG. 71, after forming the highly doped diffusion region 154aa for controlling avalanche breakdown voltage between the $N^+$ collector contact diffusion region to be formed in the following step and the $P^+$ highly doped diffusion region 154aa in $P^-$ base 154a of the ESD and a highly diffusion region 154bb for preventing the reverse of the surface of the $P^-$ well, a field oxide film 160 as a device isolation and a gate oxide film 161 are formed in the same manner as Example 1. In that case, the concentration of the highly doped diffusion regions 154aa and 154bb is about $1\times10^{17}$ cm$^{-3}$. The highly doped diffusion region 154aa is formed so as to locate under the field oxide film 160 and contact with the collector contact diffusion region to be formed in the following step.

Figure 72:
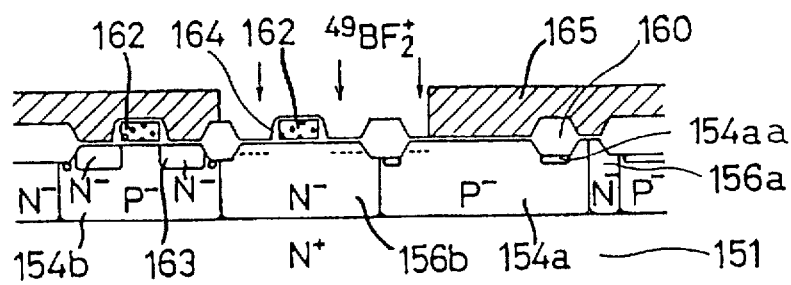

As shown in FIG. 72, a gate electrode 162 of the NMOS and PMOS, an $N^-$ diffusion regions 163 of the NMOS and a side wall spacer 164 are formed. Subsequently, $^{49}BF_2^+$ ions are implanted by using a mask 165 into regions to be a base contact diffusion region of the ESD, source/drain regions of the PMOS and a well contact diffusion region of the NMOS (not shown in FIG. 72).

Figure 73:
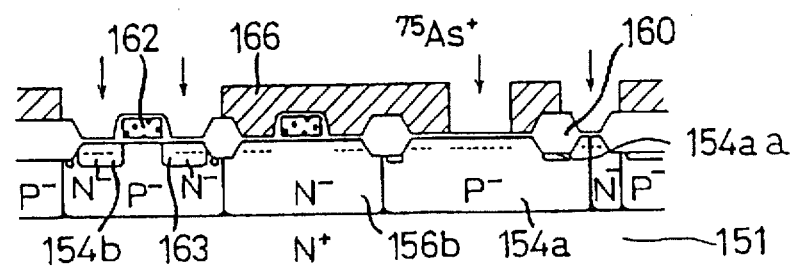

Next, as shown in FIG. 73, $^{75}As^+$ ions are implanted by using a mask 166 in the same manner as Example 1 into regions to be an emitter and a collector contact diffusion region of the ESD, source/drain regions of the NMOS and a well contact diffusion region of the PMOS (not shown in FIG. 73).

Figure 74:
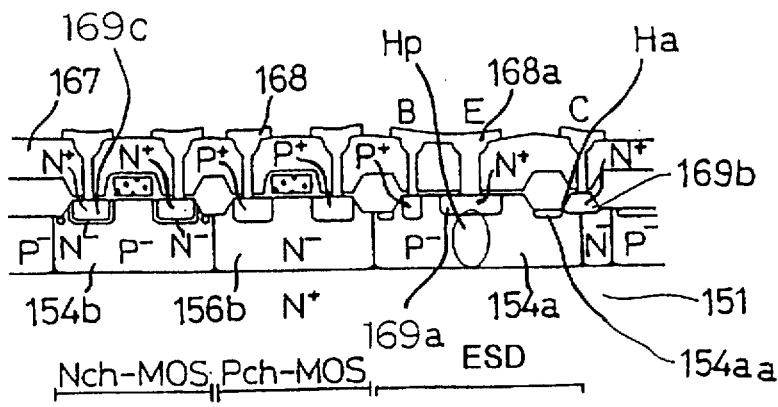

Further, as shown in FIG. 74, after forming the base contact diffusion region of the ESD and source/drain and the well contact diffusion region (not shown in FIG. 74) of the PMOS, the emitter 169a and collector contact diffusion region 169b contacted with a highly doped diffusion region 154aa of the ESD and source/drain region 169c and the well contact diffusion region (not shown in FIG. 74) of the NMOS having LDD structure, an NSG/BPSG film 167 and metal wiring 168 are formed in the same manner as Example 1. Then, the emitter and base of the ESD are shorted with a metal 168a.

Figure 75:
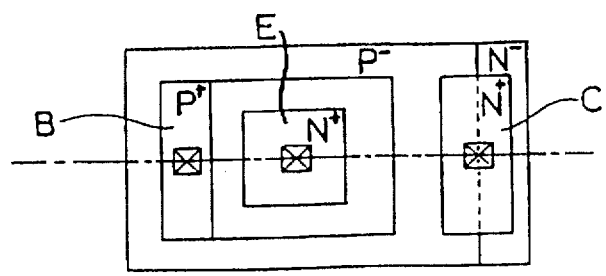
FIG. 75 is a plan view showing an arrangement of a diffusion region of an electrostatic discharge protection device of a semiconductor device of Example 8.

FIG. 75 shows a plan view of thus formed ESD in the semiconductor device and FIG. 30 shows a concentration profile beneath the emitter of the ESD.

When a reverse bias is applied to the collector of the bipolar transistor of this type used for the ESD in which the epitaxial layer has a desired thickness or less, punch-through occurs in a region shown as region Hp in FIG. 74, whereby an electric current starts flowing. If the reverse bias is further applied, transistor function and snap-back occur, whereby the electric current increases further.

If the thickness of the epitaxial layer is formed to a thickness thicker than the desired thickness, the punch-through breakdown voltage is shifted to a higher voltage. Accordingly, the avalanche breakdown occurs at about 14V between the collector contact diffusion region and highly doped diffusion regions (shown as region Ha in FIG. 74) before snap-back occurs triggered by punch-through (shown as region Hp in FIG. 74). The emitter junction is biased transitionally to the forward direction because of the decrease of voltage in the base having a high resistivity. As a result, transistor functions and snap-back occurs triggered by the avalanche breakdown as shown in FIG. 58, whereby a great electric current flows.

FIG. 12 also shows an equivalent circuit of Example 8 showing a part of the semiconductor device comprising bipolar transistor of the ESD. Incidentally, since the present example employs $N^+$ substrate as a collector, $N^+$ substrate becomes $V_{DD}$ and works as a protection device only for the $V_{DD}$ side (upper side) in FIG. 12. Therefore, another protection device is required for GND side. In that case, it is not necessary to have an $N^-$ well (collector), $N^+$ collector contact diffusion region and metal wiring (collector) of the ESD employed in the present example. If the polarity of the ESD is opposite to the present example, the $P^+$ substrate is used and grounded, and it works as a protection device only for the GND side.

The ESD of the present example does not comprise a collector sinker region, but it may be formed in an additional step. In this case, the collector sinker region may be contacted with the $P^+$ highly doped diffusion region. Further, in the present example, $P^+$ highly doped diffusion region does not necessarily contact with the collector contact diffusion region, provided that the collector sinker region contacts with the $P^+$ highly doped diffusion region. In addition, the collector contact diffusion region (and/or the collector sinker region) may be formed inside of the collector diffusion region, provided that the highly doped diffusion region contacts with the collector sinker region and/or the collector contact diffusion region.

EXAMPLE 9

Example 9 relates to a bipolar transistor type semiconductor device comprising a vertical type bipolar transistor as an ESD which causes snap-back triggered by an avalanche breakdown that can compensate high punch-through breakdown voltage caused by a variety of thickness of the epitaxial layer in the manufacturing process.

Figure 76:
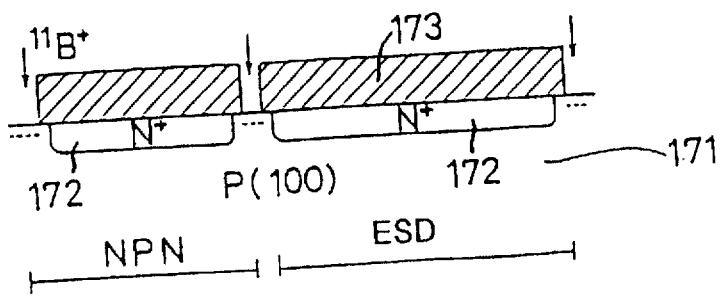
FIGS. 76 to 79 are a sectional view of a semiconductor device in each step of a first half of manufacturing process of Example 9 of the present invention.

An $N^+$ diffusion region 172 is formed in an $N^+$ buried collector formation region of the ESD and an NPN transistor on a P type silicon substrate 171 in the same manner as Example 1 as shown in FIG. 76. Then, $^{11}B^+$ ions are implanted by using a mask 173 for forming a $P^+$ buried layer.

Figure 77:
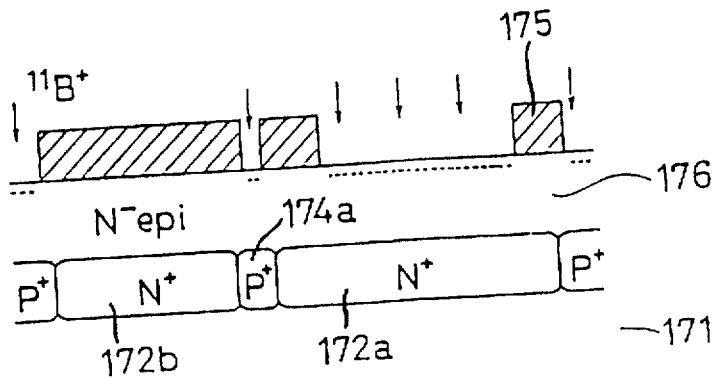

As shown in FIG. 77, an $N^-$ epitaxial layer 176 is grown with a thickness of about 3.1 micron, and a buried collector 172a of the ESD, buried collector 172b of the NPN transistor for general use are formed in the same manner as Example 1. Next, $^{11}B^+$ ions are implanted by using a mask 175 for forming a $P^-$ well having a relatively high resistivity which works as a base of the ESD and device isolation region between the ESD and bipolar transistor in the same manner as Example 1.

Figure 78:
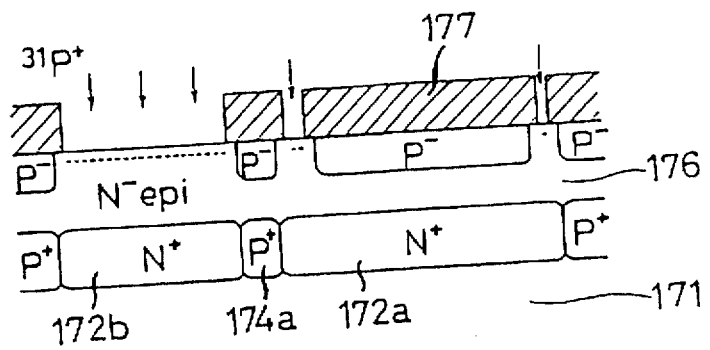

Subsequently, as shown in FIG. 78, $^{31}P^+$ ions are implanted to obtain collector diffusion regions of the ESD and NPN transistor by using a mask 177.

Figure 79:
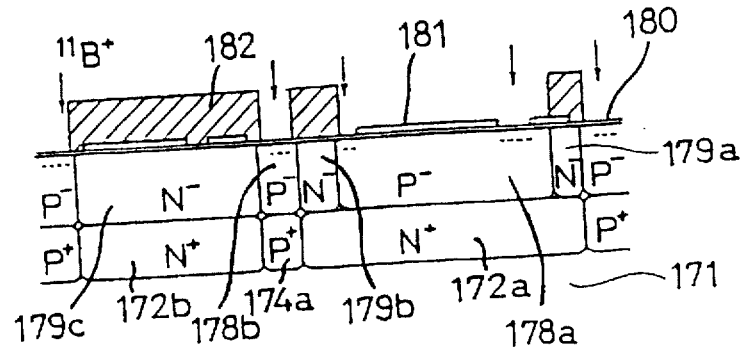

As shown in FIG. 79, a $P^-$ well comprising a base 178a of the ESD, lightly doped well 178b for device isolation and $N^-$ well comprising collector diffusion regions 179a, 179b and collector diffusion region 179c of the NPN transistor are formed. In that case, the concentration of the base 178a and lightly doped $P^-$ well 178b for device isolation which is about $2 \times 10^{16}$ cm$^{-3}$ and a diffusion depth thereof is about 1.5 microns. Further, an $SiO_2$ film 180 and a nitride film 181 are formed in the same manner as Example 1 and etched to have a desired shape. Then, $^{11}B^+$ ions are implanted into region to be $P^+$ highly doped diffusion regions by using a mask 182 in the same manner as Example 1.

Figure 80:
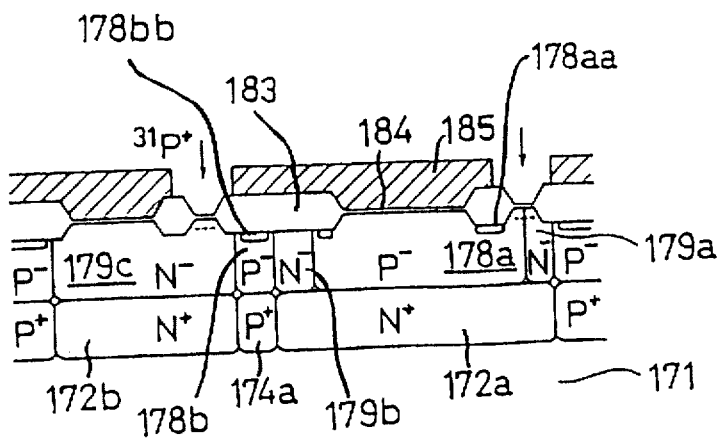
FIGS. 80 to 83 are a sectional view of a semiconductor device in each step of a second half of manufacturing process of Example 9.

Next, as shown in FIG. 80, after forming a highly doped diffusion region 178aa for controlling avalanche breakdown voltage between an $N^+$ collector sinker region and/or a collector contact diffusion region to be formed in the following step and the $P^+$ highly doped diffusion region 178aa in the $P^-$ base 178a of the ESD, a field oxide film 183 as a device isolation and a gate oxide film 184 are formed in the same manner as Example 1. In that case, the concentration of the highly doped diffusion region 178aa and 178bb is about $1 \times 10^{17}$ cm$^{-3}$. The highly doped diffusion region 178aa is formed so as to locate under the field oxide film 183 and contacts with the collector sinker region and/or the collector contact diffusion region to be formed in the following step.

Then, $^{31}P^+$ ions are implanted by using a mask 185 for forming an $N^+$ plug diffusion region (about $3 \times 10^{19}$ cm$^{-3}$) bridged in the collector diffusion region 179a and base 178a of the ESD and inside of the collector diffusion region 179c of the NPN transistor.

Figure 81:
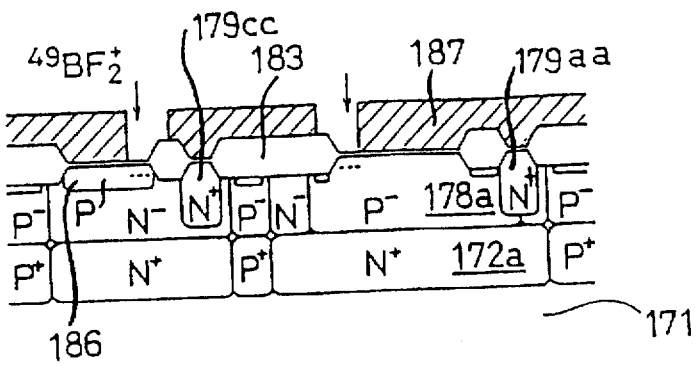

As shown in FIG. 81, after forming $N^+$ plug diffusion regions 179aa and 179cc, a base 186 of the NPN transistor is formed. Then, $^{49}BF^+$ ions are implanted by using a mask 187 into regions to be base contact diffusion regions of the ESD and NPN transistor.

Figure 82:
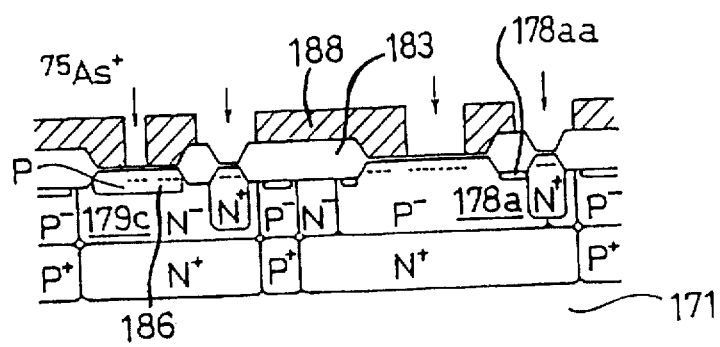

Further, as shown in FIG. 82, $^{75}As^+$ ions are implanted by using a mask 188 into regions to be emitters and collector contact diffusion regions (about $2 \times 10^{20}$ cm$^{-3}$) both of the ESD and NPN transistor.

Figure 83:
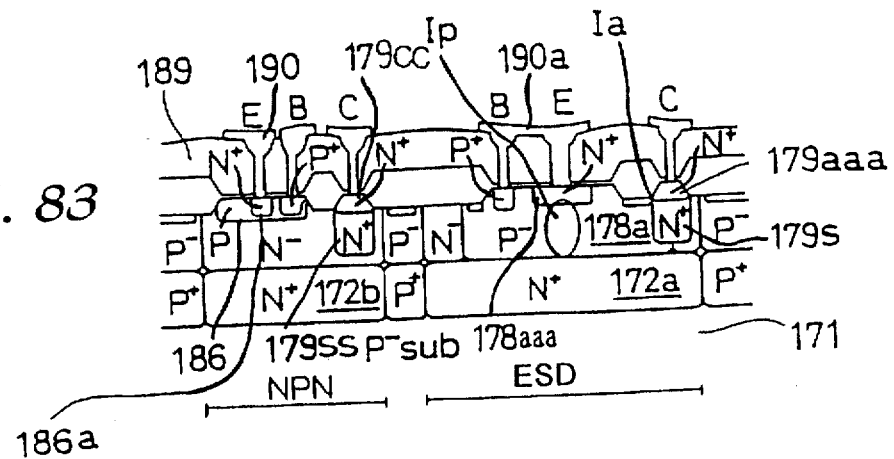

Subsequently, as shown in FIG. 83, after forming the base contact diffusion regions, and an emitter 178aaa of the ESD, an emitter 186a of the NPN transistor, a collector contact diffusion region 179aaa, a collector sinker region 179s (which is the portion of the $N^+$ plug diffusion region 179aa other than the collector contact diffusion region 179aaa) of the ESD contacted with the highly doped diffusion region 178aa and a collector sinker region 179ss (which is the portion of the plug diffusion region 179cc other than the collector contact diffusion region 179cc) of the NPN transistor, an NSG/BPSG film 189 and a metal wiring 190 are formed on the surface of a semiconductor substrate 171 in the same manner as Example 1. Then, the emitter 178aaa and base 178a of the ESD are contacted with a metal 190a.

Figure 84:
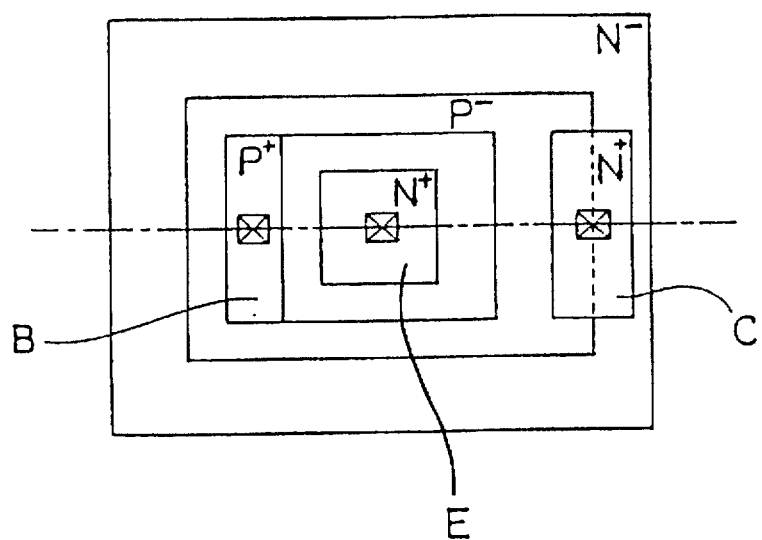
FIG. 84 is a plan view showing an arrangement of a diffusion region of an electrostatic discharge protection device of a semiconductor device of Examples 9 and 10.

FIG. 84 shows a plan view of thus formed ESD in the semiconductor device and FIG. 40 shows a concentration profile beneath the emitter of the ESD.

When a reverse bias is applied to the collector of the bipolar transistor of this type used for the ESD in which the epitaxial layer has a desired thickness or less, punch-through occurs in a region shown as region Ip in FIG. 83. If the reverse bias is further applied, transistor function and snap-back occur. As a result, the electric current increases further.

If the thickness of the epitaxial layer is formed to a thickness thicker than the desired thickness, the punch-through breakdown voltage is shifted to a higher voltage. Accordingly, the avalanche breakdown occurs at about 14V between the collector contact diffusion region and highly doped diffusion region (shown as Ia in FIG. 83) before snap-back occurred triggered by the punch-through (shown as region Ip in FIG. 83). The emitter junction is biased transitionally to the forward direction because of the decrease of voltage in the base having a high resistivity. As a result, transistor functions and snap-back occurs triggered by the avalanche breakdown as shown in FIG. 58, whereby a great electric current flows.

FIG. 12 also shows an equivalent circuit of Example 9 showing a part of the semiconductor device comprising bipolar transistor working as the ESD.

In the present example, $P^+$ highly doped diffusion region does not necessarily contact with the collector sinker region, provided that the collector contact diffusion region contacts with the $P^+$ highly doped diffusion region. In addition, the collector contact diffusion region (and/or the collector sinker region) may be formed inside of the collector diffusion region, provided that the highly doped diffusion region contacts with the collector sinker region and/or the collector contact diffusion region.

EXAMPLE 10

Example 9 relates to BiCMOS type semiconductor device comprising a vertical type bipolar transistor as an ESD which causes snap-back triggered by an avalanche breakdown that can compensate high punch-through breakdown voltage caused by a variety of thickness of the epitaxial layer if the manufacturing process.

Figure 85:
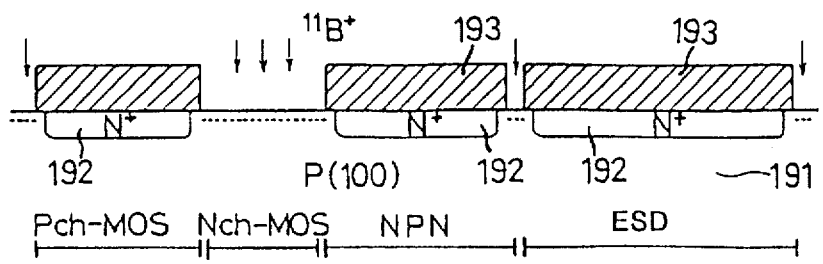
FIGS. 85 to 88 are a sectional view of a semiconductor device in each step of a first half of manufacturing process of Example 10.

An $N^+$ diffusion region 192 is formed in an $N^+$ buried collector formation region of the ESD and buried region for a PMOS and $N^+$ buried collector formation region of an NPN transistor on a P type silicon substrate 191, respectively, in the same manner as Example 1 as shown in FIG. 85. Then, $^{11}B^+$ ions are implanted (50 KeV, $1\times10^{14}$ cm$^{-2}$) to be a buried region for an NMOS and device isolation to be formed by using a mask 193.

Figure 86:
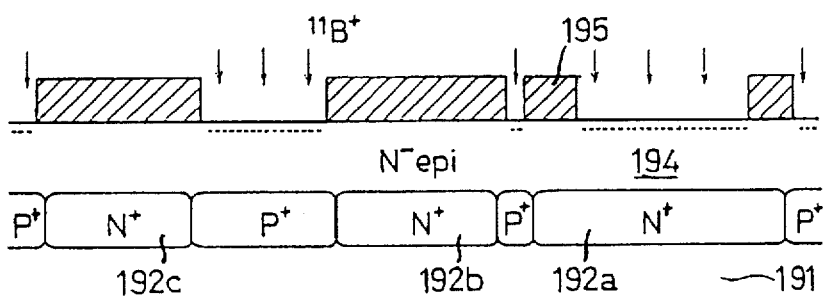

As shown in FIG. 86, an $N^-$ epitaxial layer 194 is grown with a thickness of about 3.1 micron, buried collectors 192a of the ESD, buried collector 192b of the NPN transistor and buried layer 192c of the PMOS are formed. Next, $^{11}B^+$ ions are implanted by using a mask 195 for forming a $P^-$ well having a relatively high resistivity which works as a base of the ESD, an NMOS formation region and device isolation.

Figure 87:
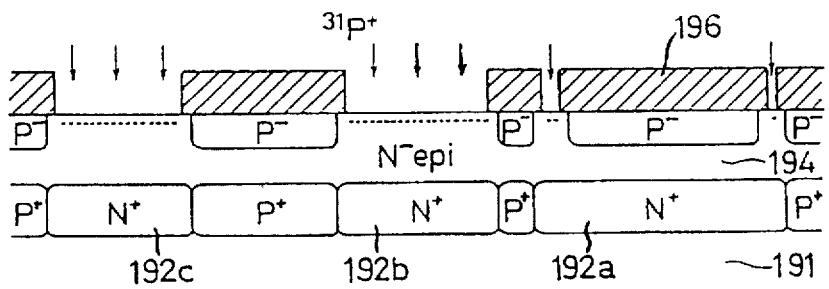

Subsequently, as shown in FIG. 87, $^{31}P^+$ ions are implanted by using a mask 196 to obtain a collector diffusion region both of the ESD and NPN transistor and an $N^-$ well of a PMOS formation region.

Figure 88:
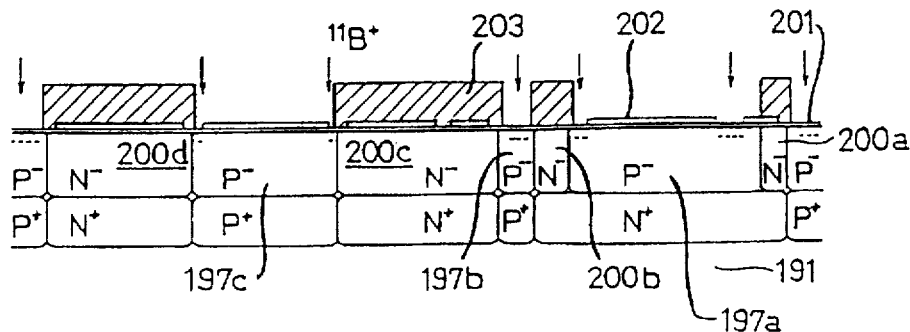

As shown in FIG. 88, a $P^-$ well comprising a base 197a, lightly doped well for device isolation 197b and lightly doped well for NMOS formation region 197c and an $N^-$ well comprising collector diffusion region 200a, 200b, a collector diffusion region 200c for NPN transistor and lightly doped well for PMOS formation region 200d are formed. In that case, the concentration of the base 197a, lightly doped well 197b for device isolation and lightly doped well 197c for the NMOS formation region is about $2\times10^{16}$ cm$^{-3}$ and a diffusion depth thereof is about 1.5 microns. Further, an SiO$_2$ film 201 and a nitride film 202 are formed and etched to have a desired shape in the same manner as Example 1. Then, $^{11}B^+$ ions are implanted into regions to be $P^+$ highly doped diffusion regions by using a mask 203 in the same manner as Example 1.

Figure 89:
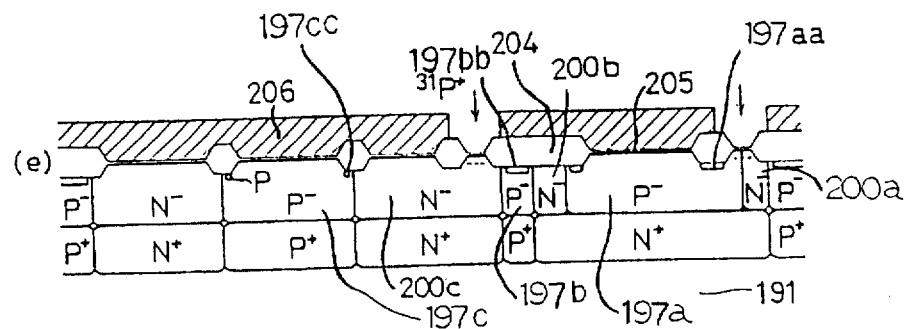
FIGS. 89 to 92 are a sectional view of a semiconductor device in each step of a second half of manufacturing process of Example 10.

Next, as shown in FIG. 89, after forming the highly doped diffusion region 197aa for controlling avalanche breakdown voltage between an $N^+$ collector sinker region and/or a collector contact diffusion region to be formed in the following step and the $P^+$ highly doped diffusion region 197aa in the $P^-$ base 197a of the ESD, and a highly doped diffusion regions 197bb, 197cc for preventing the reverse of the surface of the $P^-$ well, a field oxide film 204 as a device isolation and a gate oxide film 205 are formed in the same manner as Example 1. In that case, the concentration of the highly doped diffusion regions 197aa, 197bb, 197cc is about $1\times10^{17}$ cm$^{-3}$. The highly doped diffusion region 197aa is formed so as to locate under the field oxide film 204 and contacts with a collector contact diffusion region and/or a collector sinker region to be formed in the following step. Then, $^{31}P^+$ ions are implanted by using a mask 206 into regions to be an $N^+$ plug diffusion region (about $3\times10^{19}$ cm$^{-3}$) bridging from inside of the collector diffusion region 200a to the base 197a of the ESD and inside of the collector diffusion region 200c of the NPN transistor.

Figure 90:
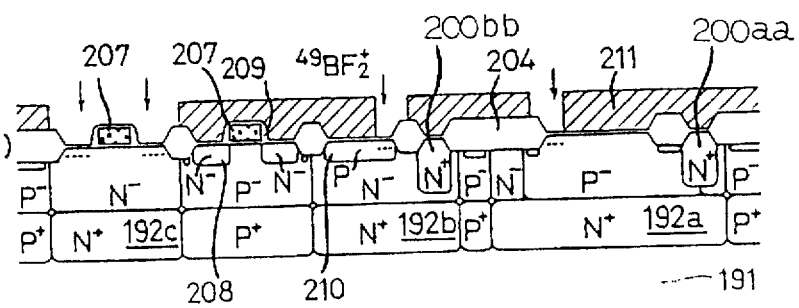

As shown in FIG. 90, after forming $N^+$ plug diffusion regions 200aa and 200bb, a gate electrode 207 of the NMOS and PMOS, $N^-$ diffusion region 208 of the NMOS, a base 210 and a side wall spacer 209 are formed in the same manner as Example 1. Then, $^{49}BF^+$ ions are implanted by using a mask 211 into regions to be a base contact diffusion regions both of the ESD and NPN transistor, source/drain regions of the PMOS and a well contact diffusion region of the NMOS (not shown in FIG. 90).

Figure 91:
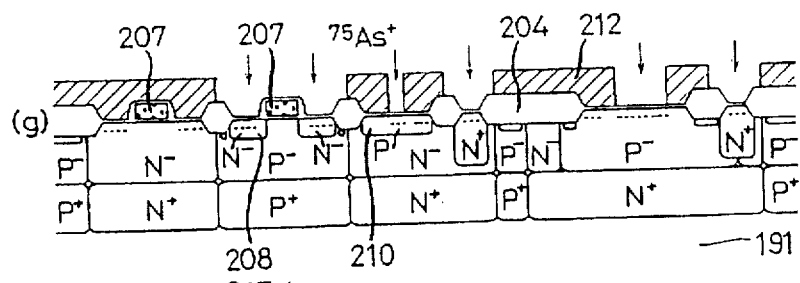

Subsequently, as shown in FIG. 91, $^{75}As^+$ ions are implanted by using a mask 212 into regions to be emitters and collector contact diffusion regions both of the ESD and NPN transistor, source/drain of the NMOS having LDD structure and a well contact diffusion region of PMOS (not shown in FIG. 91).

Figure 92:
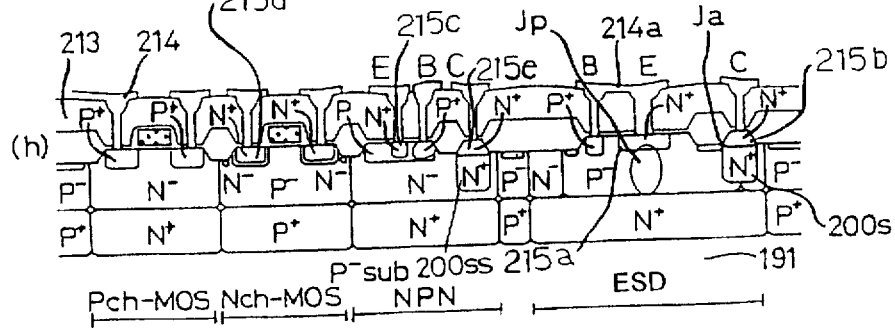

Further, as shown in FIG. 92, after forming the base contact diffusion regions both of the ESD and NPN transistor, and the emitter 215a of the ESD, emitter 215c of the NPN transistor, source/drain region and the well contact diffusion region (not shown in FIG. 92) of the PMOS, collector contact diffusion region 215b and collector sinker region 200s (which is the portion of the $N^+$ plug diffusion region 200aa other than the collector contact diffusion region 215b) of the ESD contacted with the highly doped diffusion region 197aa, collector contact diffusion region 215e and collector sinker region 200ss (which is the portion of the $N^+$ plug diffusion region 200bb other than the collector contact diffusion region 215e) of the NPN transistor, and source/drain region 215d and the well contact diffusion region (not shown in FIG. 92) of the NMOS, an NSG/BPSG film 213 and metal wiring 214 are formed on the surface of a semiconductor substrate 191 in the same manner as Example 1. Then, the emitter 215a and base 197a of the ESD are shorted with a metal 214a.

FIG. 84 shows a plan view of thus formed ESD in the semiconductor device and FIG. 40 shows a concentration profile beneath the emitter of the ESD.

When a reverse bias is applied to the collector of the bipolar transistor of this type used for the ESD in which the epitaxial layer has a desired thickness or less, punch-through occurs in a region shown as Jp in FIG. 92, whereby an electric current starts flowing. If the reverse bias is further applied, transistor function and snap-back occur and the electric current increases further.

If the thickness of the epitaxial layer is formed to a thickness thicker than the desired thickness, the punch-through breakdown voltage is shifted to a higher voltage. Accordingly, the avalanche breakdown occurs at about 14V between the collector contact diffusion region and highly doped diffusion region (shown as Ja in FIG. 92) before snap-back occurs triggered by the punch-through (shown as Jp in FIG. 92).

The emitter junction is biased transitionally to the forward direction because of the decrease of voltage in the base having a high resistivity. As a result, transistor function and snap-back occur by using the avalanche breakdown as a trigger as shown in FIG. 58, whereby a great electric current flows.

FIG. 12 also shows an equivalent circuit of Example 10 showing a part of the semiconductor device comprising bipolar transistor working as the ESD.

In the present example, $P^+$ highly doped diffusion region does not necessarily contact with the collector sinker region, provided that the collector contact diffusion region contacts with the $P^+$ highly doped diffusion region. In addition, the collector contact diffusion region (and/or the collector sinker region) may be formed inside of the collector diffusion region, provided that the highly doped diffusion region contacts with the collector sinker region and/or the collector contact diffusion region.

According to the ESD of the present invention, punch-through breakdown occurs as a trigger between the collector and emitter, thereby inducing snap-back. Accordingly, a depletion region is extended all over the base region underneath the emitter region and the concentration of electric field is prevented, so that electric current is not concentrated. As a result, a device is prevented from destroying caused by heat generation.

According to the another ESD of present invention, avalanche breakdown voltage is made stable, whereby the breakdown of the inner circuit caused by the voltage shift can be prevented.

Therefore, it is possible to provide a semiconductor device comprising the ESD which is capable of preventing a circuit from breakdown caused by applying excessive voltage.

Moreover, according to the method of the present invention, the device can be formed in the process for forming the PMOS, NMOS, CMOS, bipolar transistor and BiCMOS which are included in the device without adding a specific step, thereby reducing a production cost by simplifying manufacturing steps.

What we claimed is:

1. A semiconductor device having an electrostatic discharge protection device and at least one accompanying device selected from a group comprising an N or P channel MOS transistor, CMOS, bipolar transistor and BiCOMS, in which the electrostatic discharge protection device comprises a vertical type bipolar transistor including, a semiconductor substrate, an epitaxial layer laminated on the semiconductor substrate, a buried collector of a first conductivity type which is formed of the semiconductor substrate or which is formed from the surface of the semiconductor substrate to the epitaxial layer, a base of a second conductivity type which is a lightly doped well and formed on the epitaxial layer, and an emitter of the first conductivity type and formed on the surface layer of the base of the second conductivity type; and in which the base is adapted to have impurity concentration and depth so that a punch-through is generated between the emitter and the collector of the electrostatic discharge protection device when one of the following is applied between the emitter and the collector:

(1) a voltage higher than an operation voltage of the accompanying device; and (2) a voltage lower than a ground voltage, the base and the emitter being shorted with each other.

2. A semiconductor device according to claim 1, in which the impurity concentration of the base is in the range from about $1 \times 10^{16}$ cm$^{-3}$ to $3 \times 10^{16}$ cm$^{-3}$, and the depth of the base is in the range from 0.8 to 2.3 microns.

3. A semiconductor device having an electrostatic discharge protection device and at least one accompanying device selected from a group comprising an N or P channel MOS transistor, CMOS, bipolar transistor and BiCOMS, in which the electrostatic discharge protection device comprises a vertical type bipolar transistor including, a semiconductor substrate, an epitaxial layer laminated on the semiconductor substrate, a buried collector of a first conductivity type which is formed of the semiconductor substrate or which is formed from the surface of the semiconductor substrate to the epitaxial layer, a base of a second conductivity type which is a lightly doped well and formed on the epitaxial layer, an emitter of the first conductivity type and formed on the surface layer of the base of the second conductivity type, and a collector contact diffusion region of the first conductivity type formed on the surface of at least a part of a collector diffusion region of the first conductivity type which contacts with the buried collector;

a highly doped diffusion layer of the second conductivity type formed in the base, which contacts with the collector contact diffusion region; and in which the base is adapted to have impurity concentration and depth so that a punch-through is generated between the emitter and the collector of the electrostatic discharge protection device when one of the following is applied between the emitter and the collector:

(1) a voltage higher than an operation voltage of the accompanying device; and (2) a voltage lower than a ground voltage, the base and the emitter being shorted with each other.

4. A semiconductor device according to claim 3, in which the collector contact diffusion region is formed in a region bridging from the collector diffusion region to the base.

5. A semiconductor device according to claim 3, in which the impurity concentration of the base is in the range from about $1 \times 10^{16}$ cm$^{-3}$ to $3 \times 10^{16}$ cm$^{-3}$, and the depth of the diffusion of the base of the second conductivity type being in the range from 0.8 to 2.3 microns.

6. A semiconductor device according to claim 3, in which a collector sinker region of the first conductivity type is further formed inside of the collector diffusion region or in a region bridging from the collector diffusion region to the base, and is in contact with the highly doped diffusion region of the second conductivity type.

7. A semiconductor device according to claim 3, the highly doped diffusion region of the second conductivity type ranges from about $6 \times 10^{16}$ to $2 \times 10^{17}$ cm$^{-3}$.

8. A semiconductor device having an electrostatic discharge protection device and at least one accompanying device selected from a group comprising an N or P channel MOS transistor, CMOS, bipolar transistor and BiCMOS, in which the electrostatic discharge protection device comprises a vertical type bipolar transistor including,
- a semiconductor substrate,
- an epitaxial layer laminated on the semiconductor substrate,
- a buried collector of a first conductivity type which is formed of the semiconductor substrate or which is formed from the surface of the semiconductor substrate to the epitaxial layer,
- a base of a second conductivity type which is a lightly doped well and formed on the epitaxial layer,
- an emitter of the first conductivity type and formed on the surface layer of the base of the second conductivity type and
- a collector contact diffusion region formed on the surface of at least a part of a collector diffusion region of the first conductivity type in contact with the buried collector which include a collector sinker region of the first conductivity type;
- a highly doped diffusion layer of the second conductivity type formed in the base, which contacts with at least the collector contact diffusion region or the collector sinker region;

the base is adapted to have impurity concentration and depth so that a punch-through is generated between the emitter and the collector of the electrostatic discharge protection device when one of the following is applied between the emitter and the collector:

(1) a voltage higher than an operation voltage of the accompanying device; and (2) a voltage lower than a ground voltage, the base and the emitter being shorted with each other.

9. A semiconductor device according to claim 8, in which the collector contact diffusion region is formed in a region bridging from the collector diffusion region to the base.

10. A semiconductor device according to claim 8, in which the impurity concentration of the base is in the range from about $1 \times 10^{16}$ cm$^{-3}$ to $3 \times 10^{16}$ cm$^{-3}$, and the depth of the base is in the range from 0.8 to 2.3 microns.

11. A semiconductor device according to claim 8, the highly doped diffusion region of the second conductivity type ranges from about $6 \times 10^{16}$ to $2 \times 10^{17}$ cm$^{-3}$.

* * * * *